(12) United States Patent
Jeong

(10) Patent No.: US 11,100,862 B2
(45) Date of Patent: Aug. 24, 2021

(54) DISPLAY PANEL HAVING A BOTTOM LAYER BELOW A TRANSISTOR THAT RECEIVES DIFFERENT VOLTAGES IN DIFFERENT PERIODS

(71) Applicant: SAMSUNG DISPLAY CO., LTD., Yongin-si (KR)

(72) Inventor: Youngcheol Jeong, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 0 days.

(21) Appl. No.: 16/730,209

(22) Filed: Dec. 30, 2019

(65) Prior Publication Data

US 2020/0211465 A1   Jul. 2, 2020

(30) Foreign Application Priority Data

Dec. 31, 2018   (KR) .................. 10-2018-0173736

(51) Int. Cl.

| | | |
|---|---|---|
| *G06F 3/038* | (2013.01) | |
| *G09G 5/00* | (2006.01) | |
| *G09G 3/3258* | (2016.01) | |
| *H01L 27/32* | (2006.01) | |

(52) U.S. Cl.
CPC ......... *G09G 3/3258* (2013.01); *H01L 27/326* (2013.01); *H01L 27/3276* (2013.01); *G09G 2300/0426* (2013.01); *G09G 2300/0842* (2013.01)

(58) Field of Classification Search
None
See application file for complete search history.

(56) References Cited

U.S. PATENT DOCUMENTS

| | | | |
|---|---|---|---|
| 9,024,323 B2 | 5/2015 | Oh et al. | |
| 9,379,252 B2 | 6/2016 | Lee et al. | |
| 9,716,134 B2 | 7/2017 | Lin et al. | |
| 2004/0090186 A1* | 5/2004 | Yoshida | G09G 3/325 |
| | | | 315/169.1 |
| 2017/0117343 A1* | 4/2017 | Oh | H01L 27/3262 |
| 2019/0096913 A1* | 3/2019 | Lee | H01L 27/1218 |
| 2019/0197965 A1* | 6/2019 | Park | G09G 3/3266 |

FOREIGN PATENT DOCUMENTS

| | | |
|---|---|---|
| KR | 10-2008-0046348 | 6/2008 |
| KR | 10-2017-0126632 | 11/2017 |
| KR | 10-2017-0129508 | 11/2017 |
| KR | 10-1869625 | 6/2018 |

* cited by examiner

*Primary Examiner* — Kirk W Hermann
(74) *Attorney, Agent, or Firm* — F. Chau & Associates, LLC

(57) ABSTRACT

A display panel includes: a substrate; a first pixel arranged over the substrate and including a first transistor and a first display element electrically connected to the first transistor; and a first bottom layer arranged between the substrate and the first transistor, wherein the first bottom layer has a first voltage in a first period and has a second voltage in a second period different from the first period. The first and second voltages differ from one another.

18 Claims, 24 Drawing Sheets

DISPLAY PANEL HAVING A BOTTOM LAYER BELOW A TRANSISTOR THAT RECEIVES DIFFERENT VOLTAGES IN DIFFERENT PERIODS

CROSS-REFERENCE TO RELATED APPLICATION

This U.S. non-provisional patent application claims the benefit of priority under 35 U.S.C. § 119 to Korean Patent Application No. 10-2018-0173736, filed on Dec. 31, 2018, in the Korean Intellectual Property Office, the disclosure of which is incorporated by reference in its entirety herein.

BACKGROUND

1. Technical Field

The present disclosure relates to a display panel including a transmissive area, and a display device including the display panel.

2. Discussion of Related Art

Flat panel display devices include a liquid crystal display (LCD) device and an organic light emitting display (OLED) device. The liquid crystal display device includes a liquid crystal display panel displaying an image using light transmittance of liquid crystals, and a backlight assembly disposed under the liquid crystal display panel to provide light to the liquid crystal display panel. The organic light emitting display device displays an image using organic light emitting diodes that emit light by recombination of electrons and holes. Such an organic light emitting display device is more widely used because it has a fast response time and has a low power consumption. Recently, the purposes of flat panel display devices have become more diversified. Also, as flat panel display devices have become thinner and more lightweight, their range of use has gradually expanded.

As an area occupied by a display area of a flat panel display device increases, the display area can have various shapes, and various functions can be added to the display device. However, the large sized areas may also cause afterimages to be perceived, thereby resulting in a display device with a reduced quality.

SUMMARY

At least one exemplary embodiment of the inventive concept includes a display panel with improved display quality due to controlling a voltage applied to a bottom layer located on a backside of a pixel circuit of the display panel.

According to an exemplary embodiment of the inventive concept, a display panel includes: a substrate; a first pixel arranged over the substrate and including a first transistor and a first display element electrically connected to the first transistor; and a first bottom layer arranged between the substrate and the first transistor, wherein the first bottom layer has a first voltage in a first period and has a second voltage in a second period different from the first period. The first and second voltages differ from one another.

In an exemplary embodiment, the first pixel further includes a driving voltage line configured to provide a driving voltage, and one of the first voltage and the second voltage is the driving voltage.

The other of the first voltage and the second voltage is one of a gate voltage of a gate electrode of the first transistor, a source voltage of a source electrode of the first transistor, or a drain voltage of a drain electrode of the first transistor.

The substrate may include a display area in which the first pixel is arranged, and an peripheral area adjacent to the display area, and the substrate may further include a voltage wiring arranged in a peripheral area and electrically connected to the first bottom layer without being connected to the first pixel.

The first display element may include an organic light-emitting diode, and the first pixel may include a driving transistor, a switching transistor, and a storage capacitor, each being electrically connected to the organic light-emitting diode.

The first transistor may be the driving transistor.

In an exemplary embodiment, the display panel further includes: a second pixel arranged over the substrate and including a second transistor and a second display element electrically connected to the second transistor; and a second bottom layer arranged between the substrate and the second transistor, wherein the second bottom layer has a third voltage in a third period and has a fourth voltage in a fourth period different from the third period, and third and fourth voltages differ from one another.

In an exemplary embodiment, the display panel further includes: a first switching unit electrically connected to the first bottom layer; and a second switching unit electrically connected to the second bottom layer, wherein a switching operation of the first switching unit depends on a switching operation of the second switching unit.

A voltage of the first bottom layer may be different from a voltage of the second bottom layer during a same time period.

The first bottom layer may include metal.

According to an exemplary embodiment of the inventive concept, a display panel includes: a substrate; a plurality of first pixels, each being arranged in a first area of the substrate and including a first transistor and a first display element electrically connected to the first transistor; a plurality of second pixels, each being arranged in a second area of the substrate and including a second transistor and a second display element electrically connected to the second transistor; a first bottom layer arranged between the substrate and the first transistor; and a second bottom layer arranged between the substrate and the second transistor, wherein a voltage of the first bottom layer is different from a voltage of the second bottom layer.

The first bottom layer may be electrically insulated from the second bottom layer.

The display panel may further include: a first main power wiring arranged over the substrate and configured to provide a driving voltage; and a second main power wiring arranged over the substrate and configured to provide a common voltage.

The first bottom layer or the second bottom layer may have a same voltage as the driving voltage.

In an exemplary embodiment, the display panel further includes: a voltage wiring arranged over the substrate and not electrically connected to the first pixel and the second pixel, wherein the first bottom layer or the second bottom layer has a same voltage as that of the voltage wiring.

The first bottom layer or the second bottom layer may have a same voltage as a gate voltage, a source voltage, or a drain voltage of the first transistor or the second transistor.

In an exemplary embodiment, each of the first pixel and the second pixel include a driving transistor, a switching transistor, and a storage capacitor, and the first transistor includes the driving transistor of the first pixel, and the second transistor includes the driving transistor of the second pixel.

The second bottom layer may overlap a switching transistor and a storage capacitor of the second pixel.

The second area may include a transmissive area that transmits light.

Each of the first bottom layer and the second bottom layer may include metal.

BRIEF DESCRIPTION OF THE DRAWINGS

The inventive concept will become apparent and more readily appreciated from the following description of the exemplary embodiments, taken in conjunction with the accompanying drawings in which.

DETAILED DESCRIPTION OF THE EXEMPLARY EMBODIMENTS

Figure 1:
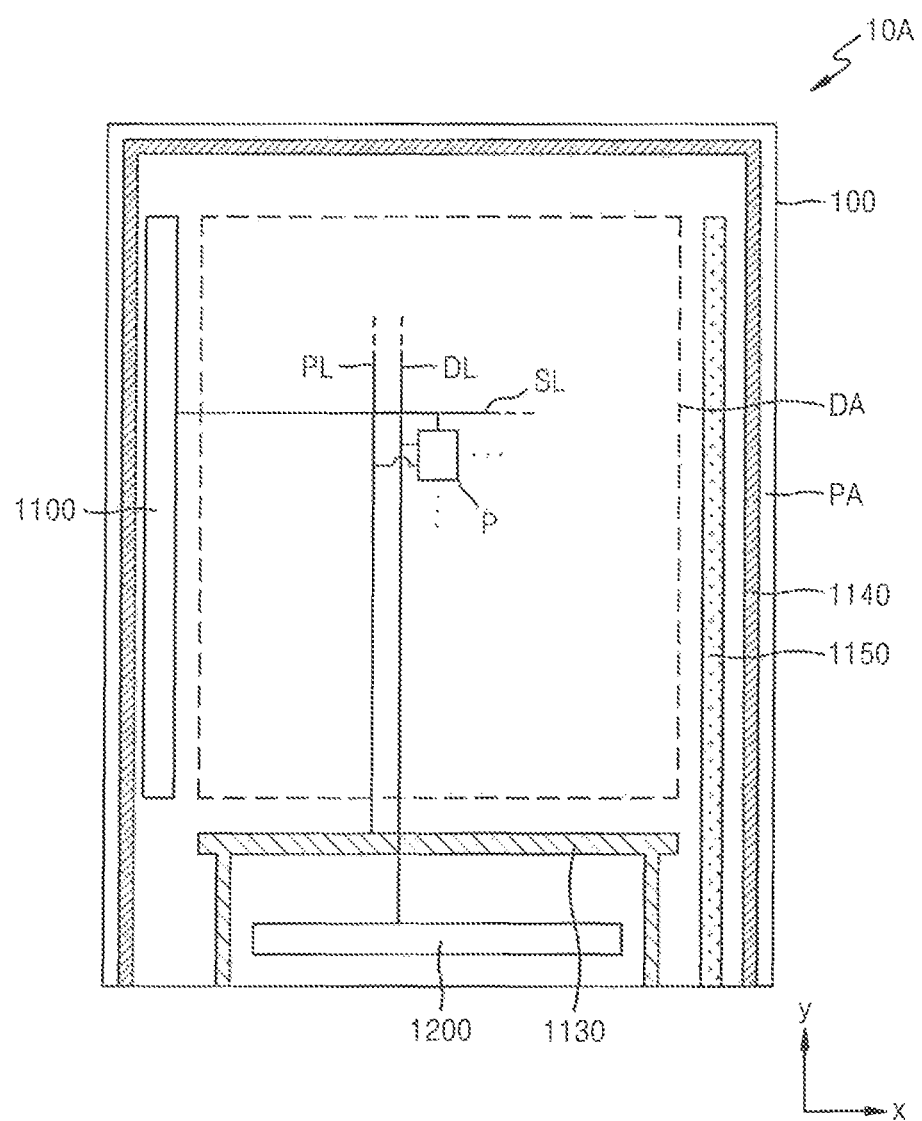
FIG. 1 is a plan view of a display panel according to an exemplary embodiment of the inventive concept.

Hereinafter, the inventive concept will be described more fully with reference to the accompanying drawings, in which exemplary embodiments thereof are shown. When description is made with reference to the drawings, like reference numerals in the drawings denote like or corresponding elements, and repeated description thereof will be omitted.

As used herein, the term "and/or" includes any and all combinations of one or more of the associated listed items. As used herein, the singular forms "a", "an" and "the" are intended to include the plural forms as well, unless the context clearly indicates otherwise.

It will be understood that when a layer, region, or component is referred to as being "formed on" another layer, region, or component, it can be directly or indirectly formed on the other layer, region, or component. That is, for example, intervening layers, regions, or components may be present.

When a certain embodiment may be implemented differently, a specific process order may be performed differently from the described order. For example, two consecutively described processes may be performed substantially at the same time or performed in an order opposite to the described order.

It will be understood that when a layer, region, or component is referred to as being "connected" to another layer, region, or component, it may be "directly connected" to the other layer, region, or component or may be "indirectly connected" to the other layer, region, or component with other layer, region, or component interposed therebetween. For example, it will be understood that when a layer, region, or component is referred to as being "connected to or electrically connected" to another layer, region, or component, it may be "directly electrically connected" to the other layer, region, or component or may be "indirectly connected or electrically connected" to other layer, region, or component with other layer, region, or component interposed therebetween.

FIG. 1 is a plan view of a display panel 10A according to an exemplary embodiment of the inventive concept. The display panel 10A may be located within a flat panel display device.

Referring to FIG. 1, the display panel 10A includes a display area DA and an outer area or a peripheral area PA (e.g., a non-display area). The display panel 10A may display an image by using light emitted from a plurality of pixels P arranged in the display area DA. Each pixel P may include an organic light-emitting diode as a display element. Each pixel P may emit, for example, red, green, or blue light, or emit red, green, blue, or white light by using an organic light-emitting diode. The display area DA may be surrounded by the peripheral area PA. The peripheral area PA may be a kind of a non-display area in which pixels P are not arranged. FIG. 1 may be understood as a figure of a substrate 100 of the display panel 10A. For example, it may be understood that the substrate 100 has the display area DA and the peripheral area PA.

A scan driver 1100 (e.g., a scan or gate driving circuit), a data driver 1200 (e.g., a data or source driving circuit), a first main power wiring 1130, and a second main power wiring 1140 may be arranged in the peripheral area PA. The scan driver 1100 providing a scan signal (or a gate signal) to each pixel P through a scan line SL (or gate line), the data driver 1200 providing a data signal to each pixel P through a data line DL (or a source line), the first main power wiring 1130 providing a driving voltage, and the second main power wiring 1140 providing a common voltage. In an embodiment, a voltage wiring 1150 configured to provide a separate voltage different from a voltage applied to each pixel P may be arranged in the peripheral area PA. Though it is shown in FIG. 1 that the data driver 1200 is adjacent to one lateral side of the substrate 100, the data driver 1200 may be arranged on a flexible printed circuit board (FPCB) electrically connected to a pad arranged on one side of the display panel 10A in another embodiment.

Figure 2:
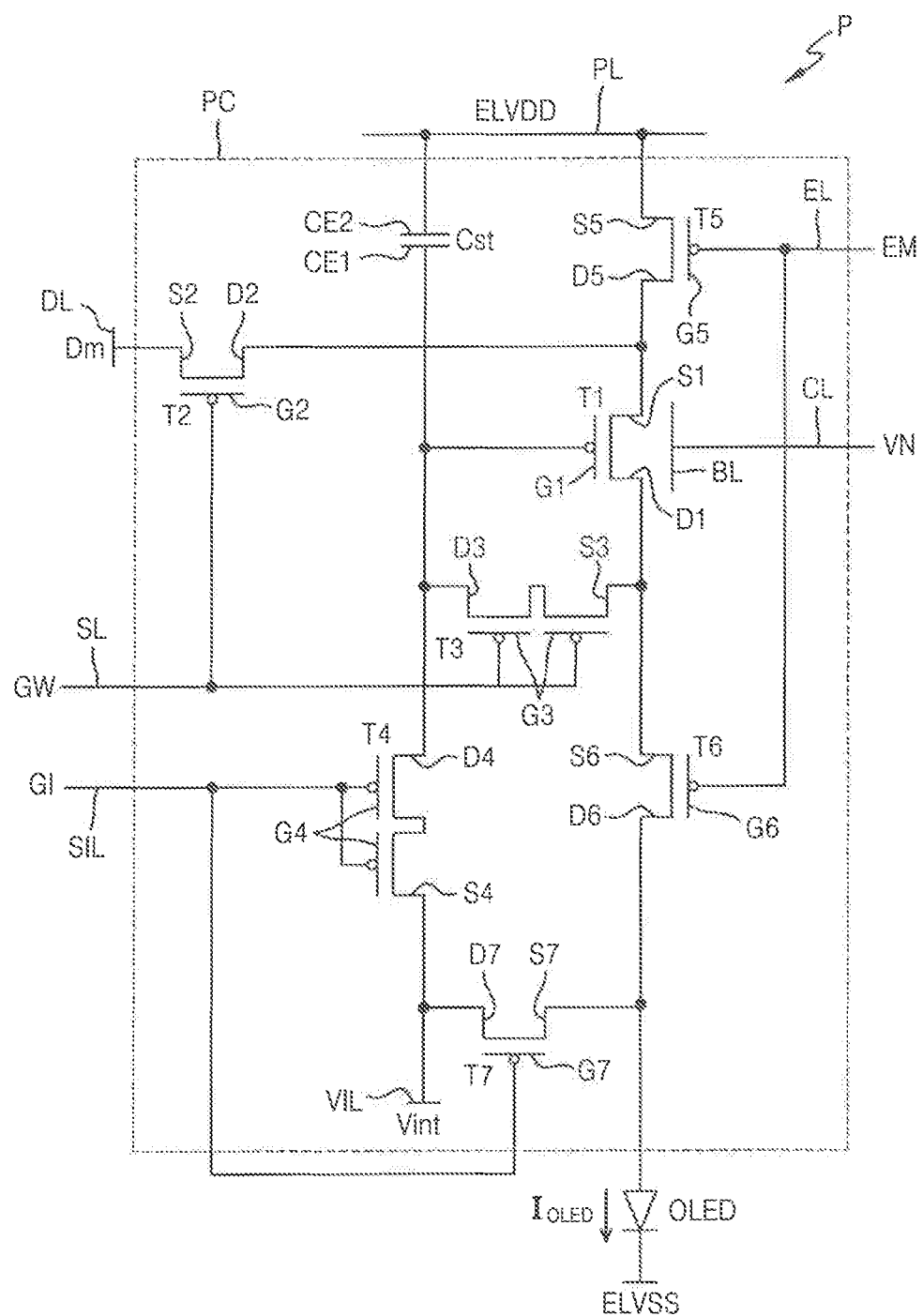
FIG. 2 is an equivalent circuit diagram of one of the pixels of a display panel according to an exemplary embodiment of the inventive concept.

FIG. 2 is an equivalent circuit diagram of one of the pixels of the display panel 10A according to an exemplary embodiment of the inventive concept.

Referring to FIG. 2, a pixel P includes a pixel circuit PC and an organic light-emitting diode OLED connected to the pixel circuit PC. The pixel circuit PC may include a plurality of transistors and a storage capacitor. The transistors and the storage capacitor may be connected to signal lines SL, SIL, EL, and DL, an initialization voltage line VIL, and a driving voltage line PL.

Though it is shown in FIG. 2 that each pixel P is connected to the signal lines SL, SIL, EL, and DL, the initialization voltage line VIL, and the driving voltage line PL, the present disclosure is not limited thereto. In another embodiment, at least one of the signal lines SL, SIL, EL, and DL, the initialization voltage line VIL, and the driving voltage line PL is shared by pixels P that neighbor each other.

The plurality of transistors include a driving transistor T1, a switching transistor T2, a compensation transistor T3, a first initialization transistor T4, an operation control transistor T5, an emission control transistor T6, and a second initialization transistor T7.

The signal lines include a scan line SL, a previous scan line SIL, an emission control line EL, and a data line DL. The scan line SL transfers a scan signal GW, the previous scan line SIL transfers a previous scan signal GI to the first initialization transistor T4 and the second initialization transistor T7, the emission control line EL transfers an emission control signal EM to the operation control transistor T5 and the emission control transistor T6, and the data line DL intersects with the scan line SL and transfers a data signal Dm. The driving voltage line PL transfers a driving voltage ELVDD to the driving transistor T1, and the initialization voltage line VIL transfers an initialization voltage Vint that initializes the driving transistor T1 and a pixel electrode of the organic light-emitting diode OLED.

A driving gate electrode G1 of the driving transistor T1 is connected to a first storage capacitor plate CE1 of a storage capacitor Cst, a driving source electrode S1 of the driving transistor T1 is connected to the driving voltage line PL through the operation control transistor T5, and a drain electrode D1 of the driving transistor T1 is electrically connected to the pixel electrode of the organic light-emitting diode OLED through the emission control transistor T6. The driving transistor T1 receives a data signal Dm and supplies a driving current $I_{OLED}$ to the organic light-emitting diode OLED in response to a switching operation of the switching transistor T2.

A switching gate electrode G2 of the switching transistor T2 is connected to the scan line SL, a switching source electrode S2 of the switching transistor T2 is connected to the data line DL, and a switching drain electrode D2 of the switching transistor T2 is connected to the driving source electrode S1 of the driving transistor T1 and simultaneously connected to the driving voltage line PL through the operation control transistor T5. The switching transistor T2 may be turned on in response to a scan signal GW transferred through the scan line SL and may perform a switching operation of transferring a data signal Dm transferred through the data line DL to the driving source electrode S1 of the driving transistor T1.

A compensation gate electrode G3 of the compensation transistor T3 is connected to the scan line SL, a compensation source electrode S3 of the compensation transistor T3 is connected to the driving drain electrode D1 of the driving transistor T1 and simultaneously connected to the pixel electrode of the organic light-emitting diode OLED through the emission control transistor T6, and a compensation drain electrode D3 of the compensation transistor T3 is connected to the first storage capacitor plate CE1 of the storage capacitor Cst, the first initialization drain electrode D4 of the first initialization transistor T4, and the driving gate electrode G1 of the driving transistor T1. The compensation transistor T3 may be turned on in response to a scan signal GW transferred through the scan line SL and may diode-connect the driving transistor T1 by electrically connecting the driving gate electrode G1 and the driving drain electrode D1 of the driving transistor T1.

A first initialization gate electrode G4 of the first initialization transistor T4 is connected to the previous scan line SIL, a first initialization source electrode S4 of the first initialization transistor T4 is connected to the second initialization drain electrode D7 of the second initialization transistor T7 and the initialization voltage line VIL, and a first initialization drain electrode D4 of the first initialization transistor T4 is connected to the first storage capacitor plate CE1 of the storage capacitor Cst, the compensation drain electrode D3 of the compensation transistor T3, and the driving gate electrode G1 of the driving transistor T1. The first initialization transistor T4 may be turned on in response to a previous scan signal GI transferred through the previous scan line SIL and may perform an initialization operation of initializing a voltage of the driving gate electrode G1 of the driving transistor T1 by transferring the initialization voltage Vint to the driving gate electrode G1 of the driving transistor T1.

An operation control gate electrode G5 of the operation control transistor T5 is connected to the emission control line EL, an operation control source electrode S5 of the operation control transistor T5 is connected to the driving voltage line PL, and an operation control drain electrode D5 of the operation control transistor T5 is connected to the driving source electrode S1 of the driving transistor T1 and the switching drain electrode D2 of the switching transistor T2.

An emission control gate electrode G6 of the emission control transistor T6 is connected to the emission control line EL, an emission control source electrode S6 of the emission control transistor T6 is connected to the driving drain electrode D1 of the driving transistor T1 and the compensation source electrode S3 of the compensation transistor T3, and an emission control drain electrode D6 of the emission control transistor T6 is electrically connected to the second initialization source electrode S7 of the second initialization transistor T7 and the pixel electrode of the organic light-emitting diode OLED.

In an exemplary embodiment, the operation control transistor T5 and the emission control transistor T6 are simultaneously turned on in response to an emission control signal EM transferred through the emission control line EL, and the driving voltage ELVDD is transferred to the organic light-emitting diode OLED and thus the driving current $I_{OLED}$ may flow through the organic light-emitting diode OLED.

A second initialization gate electrode G7 of the second initialization transistor T7 is connected to the previous scan line SIL, a second initialization source electrode S7 of the second initialization transistor T7 is connected to the emission control drain electrode D6 of the emission control transistor T6 and the pixel electrode of the organic light-emitting diode OLED, and a second initialization drain electrode D7 of the second initialization transistor T7 is connected to the first initialization source electrode S4 of the first initialization transistor T4 and the initialization voltage line VIL. The second initialization transistor T7 is turned on in response to a previous scan signal GI transferred through the previous scan line SIL and initializes the pixel electrode of the organic light-emitting diode OLED.

Though FIG. 2 shows the case where the first initialization transistor T4 and the second initialization transistor T7 are connected to the previous scan line SIL, embodiments of the present inventive concept are not limited thereto. In another embodiment, the first initialization transistor T4 is connected to the previous scan line SIL and driven in response to a previous scan signal GI, and the second initialization transistor T7 is connected to a separate signal line (e.g. the next scan line) and driven in response to a signal transferred through the separate signal line.

A second storage capacitor plate CE2 of the storage capacitor Cst is connected to the driving voltage line PL, and an opposite electrode of the organic light-emitting diode OLED is connected to a common voltage ELVSS. Therefore, the organic light-emitting diode OLED may display an image by receiving the driving current $O_{OLED}$ from the driving transistor T1 and emitting light. In an embodiment, the driving voltage ELVDD is higher than the common voltage ELVSS.

Though it is shown in FIG. 2 that each of the compensation transistor T3 and the first initialization transistor T4 has a dual gate electrode, each of the compensation transistor T3 and the first initialization transistor T4 may have one gate electrode in an alternate embodiment.

In an exemplary embodiment, the pixel circuit PC includes a bottom layer BL arranged below at least one (e.g. the driving transistor T1) of the transistors. A voltage VN is applied to the bottom layer BL through a wiring CL. In this case, the voltage VN may be varied or selected by a control signal, etc. For example, the bottom layer BL may have the same voltage as the driving voltage ELVDD, the initialization voltage Vint, or a voltage such as a gate voltage of a gate electrode of one of the transistors included in the pixel circuit PC, a source voltage of a source electrode of one of the transistors included in the pixel circuit PC, and a drain voltage of a drain electrode of one of the transistors included in the pixel circuit PC. For example, a voltage generator used to provide one of the driving voltage ELVDD, the initialization voltage Vint, the gate voltage, the source voltage, or the drain voltage may be used to provide the voltage to the bottom layer BL. The voltage generator could be disposed in the peripheral area PA or external to the display panel 10A. Alternatively, a separate voltage different from the above-mentioned voltages may be applied to the bottom layer BL. For example, the bottom layer BL may be connected to the voltage wiring 1150 provided in the peripheral area PA of the display panel 10A (see FIG. 1). The bottom layer BL may be at least arranged below the driving transistor T1 to prevent or minimize occurrences of a transient afterimage. The bottom layer BL may overlap the driving transistor T1 as described below with reference to FIG. 3. Alternatively, the bottom layer BL may overlap the driving transistor T1 and other transistor(s), or may be arranged below the above-mentioned transistors to overlap all the transistors included in the pixel circuit PC. The voltage generator may be used to provide a voltage to the bottom layer BL.

Though it is shown in FIG. 2 that the pixel circuit PC includes seven transistors and one storage capacitor, embodiments of the present inventive concept are not limited thereto. Though the number of transistors and the number of storage capacitors may be six or less, or eight or more and may be variously changed depending on a design of the pixel circuit PC, description is made based on the pixel circuit PC shown in FIG. 2, for convenience.

Figure 3:
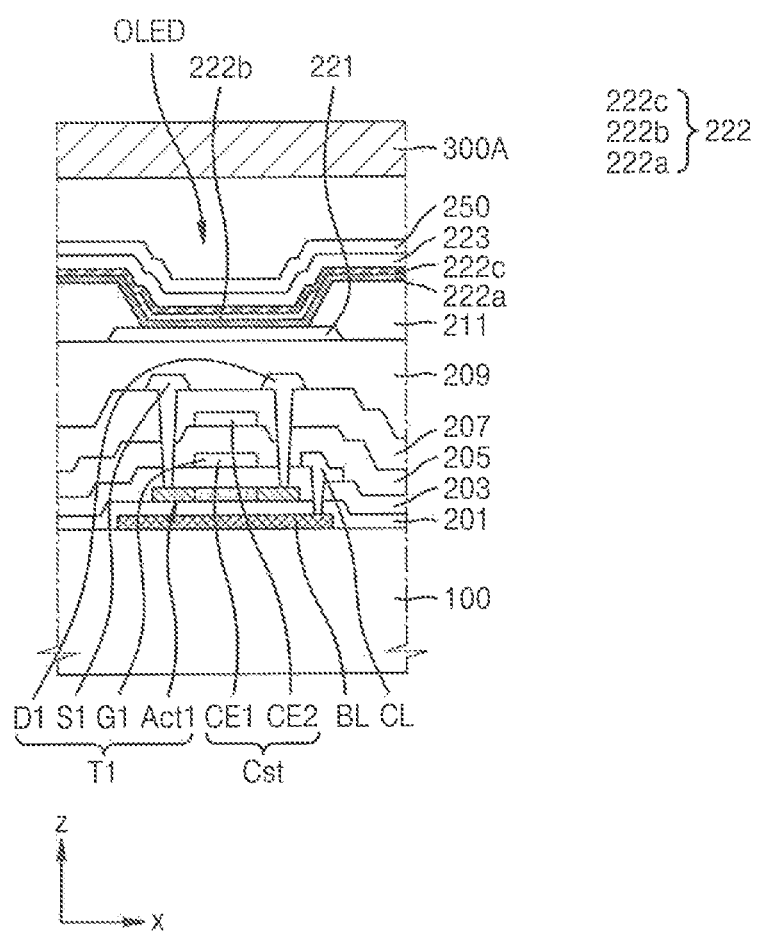
FIG. 3 is a cross-sectional view of a portion of a display panel according to an exemplary embodiment of the inventive concept.

FIG. 3 is a cross-sectional view of a portion of a display panel according to an exemplary embodiment of the inventive concept. The display panel may correspond to the display panel 10A of FIG. 1.

Referring to FIG. 3, the pixel circuit PC including the driving transistor T1 and the storage capacitor Cst is arranged over the substrate 100. Though FIG. 3 shows the driving transistor T1 among the transistors included in the pixel circuit PC described above with reference to FIG. 2, the other transistors may have the same structure as that of the driving transistor T1.

The substrate 100 may include a polymer resin or glass. In an embodiment, the substrate 100 may include a glass material containing $SiO_2$ as a main component or may include a resin such as reinforced plastic, and may be rigid. Alternatively, the substrate 100 may include a flexible substrate including a polymer resin. For example, the substrate 100 may have a stacked structure including a layer including a polymer resin such as polyimide, and a barrier layer on the polymer resin layer.

The bottom layer BL is arranged between the substrate 100 and at least one transistor. With regard to this, it is shown in FIG. 3 that the bottom layer BL is arranged between the substrate 100 and the driving transistor T1.

In an embodiment, the bottom layer BL is a conductive layer. The conductive layer may be a metal layer. For example, the bottom layer BL may include Al, Pt, Pd, Ag, Mg, Au, Ni, Nd, Ir, Cr, Mo, Ti, W, and/or Cu. The bottom layer BL may include a single layer or a multi-layer including the above materials. Though it is shown in FIG. 3 that the bottom layer BL is located directly on a top surface of the substrate 100, an inorganic insulating layer may be arranged below the bottom layer BL in another embodiment. The inorganic insulating layer may include silicon nitride or silicon oxide. For example, the inorganic insulating layer may be located between the substrate 100 and the bottom layer BL. In an exemplary embodiment, a part of the bottom surface of the bottom layer BL directly contacts the substrate 100 and a remaining part of the bottom surface of the bottom layer BL directly contacts the inorganic insulating layer (i.e., the inorganic insulating layer only overlaps a part of the bottom layer BL).

A buffer layer 201 may be located on the bottom layer BL. The buffer layer 201 may include an inorganic insulating material such as silicon oxide, silicon nitride, and silicon oxynitride. In an exemplary embodiment, the buffer layer 201 completely covers the bottom layer BL. The buffer layer 201 may include a single layer or a multi-layer including the above inorganic insulating materials.

The driving transistor T1 and the storage capacitor Cst may be arranged on the buffer layer 201. The driving transistor T1 includes a driving semiconductor layer Act1, a driving gate electrode G1, a driving source electrode S1, and a driving drain electrode D1.

The driving semiconductor layer Act1 may include polycrystalline silicon. In another embodiment, the driving semiconductor layer Act1 includes amorphous silicon. Alternatively, the driving semiconductor layer Act1 may include an oxide semiconductor including In, Ga, Sn, Zr, V, Hf, Cd, Ge, Cr, Ti, and/or Zn. For example, the driving semiconductor layer Act1 may include an oxide semiconductor such as indium gallium oxide (IGZO), zinc tin oxide (ZTO), and zinc indium oxide (ZIO).

The driving gate electrode G1 may include Al, Pt, Pd, Ag, Mg, Au, Ni, Nd, Ir, Cr, Ca, Mo, Ti, W, and/or Cu. The driving gate electrode G1 may include a single layer or a multi-layer including the above materials.

The gate insulating layer 203 is arranged between the driving semiconductor layer Act1 and the driving gate electrode G1. The gate insulating layer 203 may include an inorganic insulating material such as silicon oxide, silicon nitride, and silicon oxynitride. The gate insulating layer 203 may include a single layer or a multi-layer including the above inorganic insulating material.

The driving gate electrode G1 may serve as the first storage capacitor plate CE1, which is a lower electrode of the storage capacitor Cst. A second storage capacitor plate CE2 is located over the first storage capacitor plate CE1, the second storage capacitor plate CE2 overlapping the first storage capacitor plate CE1 with a first interlayer insulating layer 205 therebetween. Though it is shown in FIG. 3 that the storage capacitor Cst overlaps the driving transistor T1, the storage capacitor Cst does not overlap the driving transistor T1 in another embodiment. In this embodiment, the first storage capacitor plate CE1 and the driving gate electrode G1 are individually formed. For example, an element representing both the first storage capacitor plate CE1 and the driving gate electrode G1 may be replaced with a first element and a second element that are spaced apart from one another and disposed on the gate insulating layer 203.

A second interlayer insulating layer 207 may be located on the storage capacitor Cst and may include an inorganic insulating material such as silicon oxide, silicon nitride, and silicon oxynitride. The second interlayer insulating layer 207 may include a single layer or a multi-layer including the above inorganic insulating materials.

The driving source electrode S1 and the driving drain electrode D1 are located on the second interlayer insulating layer 207. The driving source electrode S1 and the driving drain electrode D1 may include a material having excellent conductivity. The driving source electrode S1 and the driving drain electrode D1 may include at least one of a conductive material including Mo, Al, Cu, Ti, etc. and include a single layer or a multi-layer including the above materials. In an embodiment, the driving source electrode S1 and the driving drain electrode D1 may include a multi-layer including Ti/Al/Ti.

The driving source electrode S1 and the driving drain electrode D1 are connected to a driving source region and a driving drain region of the driving semiconductor layer Act1, respectively. The driving semiconductor layer Act1 may include a driving channel region overlapping the driving gate electrode G1 and include the driving source region and the driving drain region respectively on two opposite sides of the driving channel region. For example, the driving semiconductor layer Act1 is depicted in FIG. 3 has including a first shaded region of a first pattern disposed between two shaded regions of a second other pattern, where one of the shaded regions of the second pattern corresponds to the driving source region, the other of the two shaded regions of the second pattern corresponds to the driving drain region, and the shaded region of the first pattern corresponds to the driving channel region. Though it is shown in FIG. 3 that the driving source electrode S1 and the driving drain electrode D1 are connected to the driving source region and the driving drain region, respectively, it may be understood that the driving source region corresponds to the driving source electrode S1 and the driving drain region corresponds to the driving drain electrode D1 in another embodiment.

The wiring CL may be located over the bottom layer BL. The wiring CL may be connected to the bottom layer BL through a contact hole passing through at least one insulating layer arranged between the bottom layer BL and the wiring CL. In an embodiment, it is shown in FIG. 3 that the wiring CL is located on the same layer as a layer on which the driving gate electrode G1 is arranged, and is connected to the bottom layer BL through a contact hole passing through the buffer layer 201 and the gate insulating layer 203. In another embodiment, the wiring CL is arranged on the same layer as a layer on which the second storage capacitor plate CE2 is arranged. Alternatively, the wiring CL may be located on the same layer as a layer on which the driving source electrode S1 and/or the driving drain electrode D1 are arranged.

The driving transistor T1 may be covered by a planarization insulating layer 209. The planarization insulating layer 209 may include an approximately flat top surface. The planarization insulating layer 209 may include a general-purpose polymer such as polymethylmethacrylate (PMMA) and polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof. In an embodiment, the planarization insulating layer 209 includes polyimide. Alternatively, the planarization insulating layer 209 may include inorganic and organic insulating materials.

A pixel electrode 221 may be located on the planarization insulating layer 209. The pixel electrode 221 may be electrically connected to the pixel circuit PC (see FIG. 2) including the driving transistor T1 and the storage capacitor Cst, etc. through a contact hole formed in the planarization insulating layer 209.

The pixel electrode 221 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). In another embodiment, the pixel electrode 221 may include a reflective layer including Ag, Mg, Al, Pt, Pd, Au, Ni, Nd, Ir, Cr, or a compound thereof. In another embodiment, the pixel electrode 221 may further include a layer including ITO, IZO, ZnO, or $In_2O_3$ on and/or under the above reflective layer.

A pixel-defining layer 211 may be formed on the pixel electrode 221. The pixel-defining layer 211 may include an opening exposing a top surface of the pixel electrode 221 and cover edges of the pixel electrode 221. The pixel-defining layer 211 may include an organic insulating material. Alternatively, the pixel-defining layer 211 may include an inorganic insulating material such as silicon oxide, silicon nitride, and silicon oxynitride. Alternatively, the pixel-defining layer 211 may include an organic insulating material and an inorganic insulating material.

An intermediate layer 222 may be disposed on the pixel electrode 221 and on the pixel-defining layer 211. The intermediate layer 222 includes an emission layer 222b. The intermediate layer 222 may include a first functional layer 222a arranged under the emission layer 222b and/or a second functional layer 222c arranged on the emission layer 222b. The emission layer 222b may include a polymer or a low molecular weight organic material, each emitting light of a predetermined color.

The first functional layer 222a may include a single layer or a multi-layer. For example, in the case where the first functional layer 222a includes a polymer material, the first functional layer 222a may include a hole transport layer (HTL), which has a single-layered structure. In the case where the first functional layer 222a includes a low molecular weight material, the first functional layer 222a may include a hole injection layer (HIL) and an HTL.

The second functional layer 222c may be omitted. For example, in the case where the first functional layer 222a and the emission layer 222b include a polymer material, it is preferable that the second functional layer 222c is provided. The second functional layer 222c may be a single layer or a multi-layer. The second functional layer 222c may include an electron transport layer (ETL) and/or an electron injection layer (EIL).

The emission layer 222b corresponds to the opening of the pixel-defining layer 211. For example, the emission layer 222b may cover the opening of the pixel-defining layer 211 and a part of the pixel electrode 221. In contrast, the first functional layer 222a and the second functional layer 222c may be formed entirely over the substrate 100.

An opposite electrode 223 may be disposed on the intermediate layer 222. The opposite electrode 223 may include a conductive material having a low work function. For example, the opposite electrode 223 may include a (semi) transparent layer including Ag, Mg, Al, Pt, Pd, Au, Ni, Nd, Ir, Cr, Li, Ca, and/or an alloy thereof. Alternatively, the opposite electrode 223 may further include a layer including ITO, IZO, ZnO, or $In_2O_3$ on the (semi) transparent layer including the above-mentioned material. The opposite electrode 223 may be formed as one body and provided in not only the display area DA but also in a portion of the peripheral area PA. The intermediate layer 222 and the opposite electrode 223 may be formed by a thermal deposition method.

A capping layer 250 may be located on the opposite electrode 223. For example, the capping layer 250 may include LiF and may be formed by a thermal deposition method. Alternatively, the capping layer 250 may include an inorganic insulating material such as silicon oxide, silicon nitride, and silicon oxynitride. Alternatively, the capping layer 250 may include an organic insulating material. Alternatively, the capping layer 250 may be omitted.

The organic light-emitting diode OLED including the pixel electrode 221, the intermediate layer 222, and the opposite electrode 223 may be covered by an encapsulation member. FIG. 3 shows the encapsulation member implemented as an encapsulation substrate 300A. The encapsulation substrate 300A may include a glass material or a polymer resin.

Figure 4:
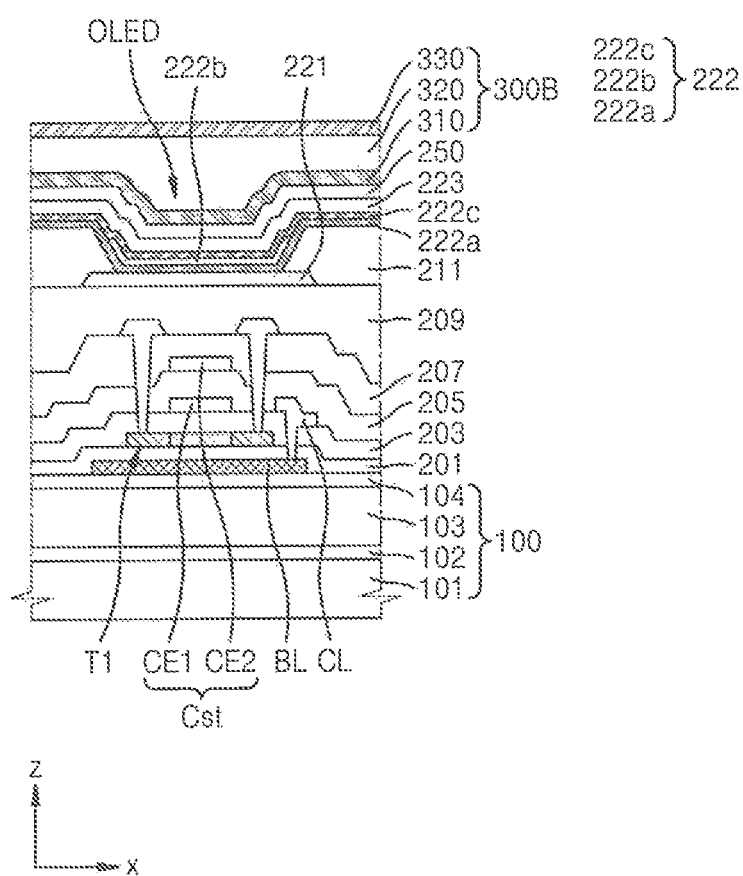
FIG. 4 is a cross-sectional view of a display panel according to an exemplary embodiment of the inventive concept.

FIG. 4 is a cross-sectional view of a display panel according to an exemplary embodiment of the inventive concept. The display panel may correspond to the display panel 10A of FIG. 1.

Referring to FIG. 4, the substrate 100 has a stacked structure including a polymer resin and an inorganic insulating material. For example, the substrate 100 may have a structure in which a first base layer 101, a first barrier layer 102, a second base layer 103, and a second barrier layer 104 are sequentially stacked.

The first base layer 101 and the second base layer 103 may include a polymer resin such as polyethersulfone (PES), polyarylate (PAR), polyetherimide (PEI), polyethylene naphthalate (PEN), polyethylene terephthalate (PET), polyphenylene sulfide (PPS), polyarylate, polyimide (PI), polycarbonate (PC), cellulose triacetate (TAC), and cellulose acetate propionate (CAP).

Each of the first barrier layer 102 and the second barrier layer 104 may include a barrier layer configured to prevent penetration of an external foreign substance and include a single layer or a multi-layer including an inorganic material such as silicon oxide, silicon nitride, and silicon oxynitride.

The organic light-emitting diode OLED formed over the substrate 100 may be covered by an encapsulation member. With regard to this, it is shown in FIG. 4 that the encapsulation member includes a thin-film encapsulation layer 300B including at least one inorganic encapsulation layer and at least one organic encapsulation layer. For example, the thin-film encapsulation layer 300B may include a first inorganic encapsulation layer 310, a second inorganic encapsulation layer 330, and an organic encapsulation layer 320 therebetween. However, the number of inorganic encapsulation layers and the number of organic encapsulation layers and/or a stacking sequence may be variously changed.

A structure between the substrate 100 and the thin-film encapsulation layer 300B is the same as that described above with reference to FIG. 3. For example, the bottom layer BL is arranged between the substrate 100 and the driving transistor T1, and a voltage may be applied to the bottom layer BL through a wiring CL. The voltage may be varied or selected by a control signal, etc. as described with reference to FIG. 2. For example, the bottom layer BL may be disposed between the second barrier layer 104 and the buffer layer 201.

Figure 5:
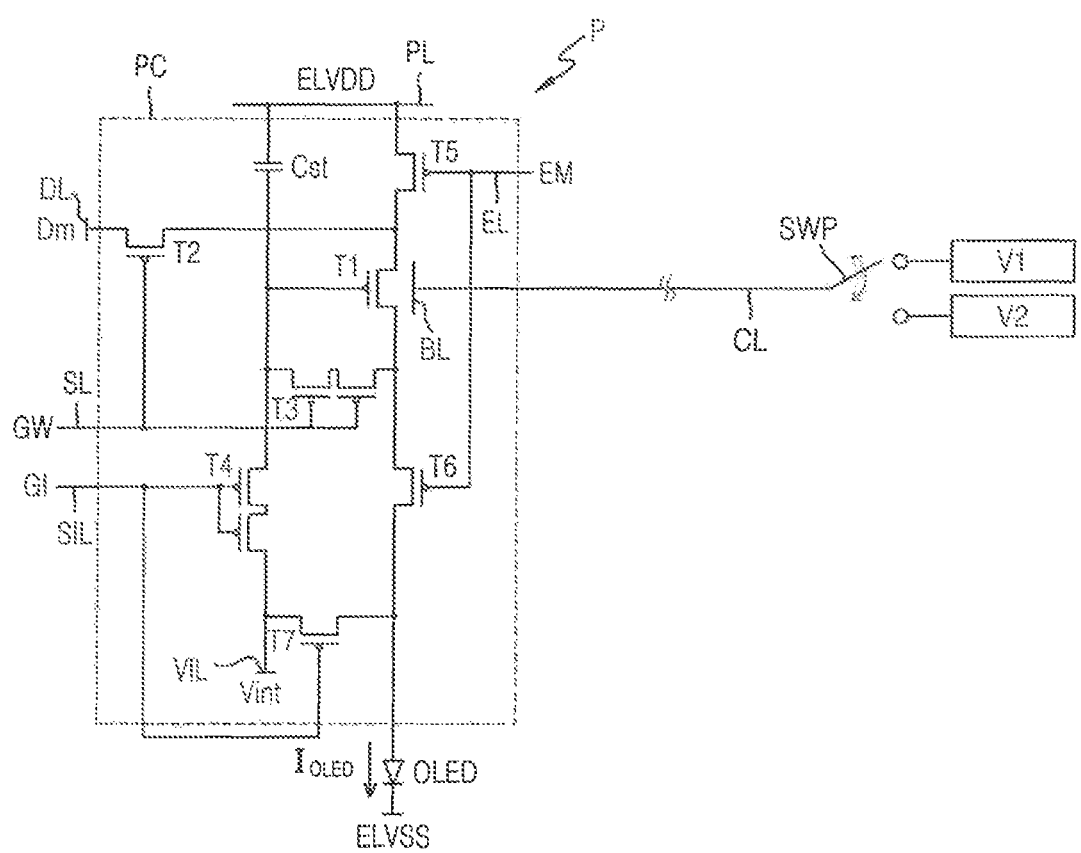
FIG. 5 is an equivalent circuit diagram of one of the pixels of a display panel according to an exemplary embodiment of the inventive concept.
Figure 6:
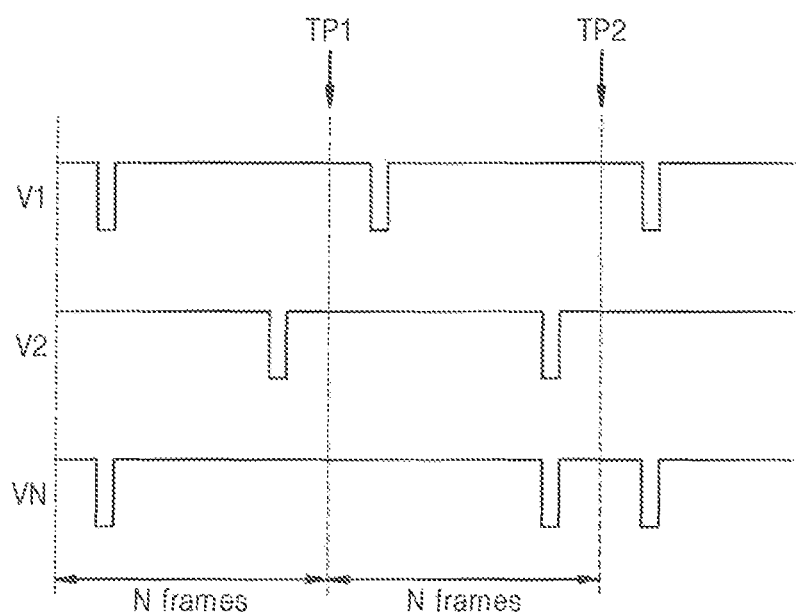
FIG. 6 is a timing diagram of a voltage applied to a bottom layer of a display panel according to an exemplary embodiment of the inventive concept.
Figure 7:
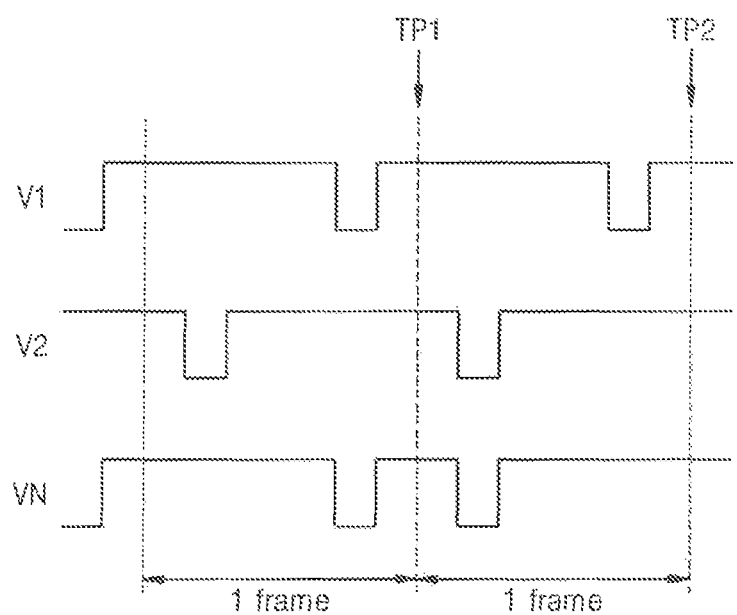
FIG. 7 is a timing diagram of a voltage applied to a bottom layer of a display panel according to an exemplary embodiment of the inventive concept.

FIG. 5 is an equivalent circuit diagram of one of the pixels of the display panel according to an exemplary embodiment of the inventive concept, FIG. 6 is a timing diagram of a voltage applied to the bottom layer BL provided to the display panel according to an exemplary embodiment of the inventive concept, and FIG. 7 is a timing diagram of a voltage applied to the bottom layer BL provided to the display panel according to an exemplary embodiment of the inventive concept.

Referring to FIG. 5, the bottom layer BL is connected to a switching unit SWP through the wiring CL, and a first voltage V1 or a second voltage V2 may be applied to the bottom layer BL by a switching operation of the switching unit SWP. The switching unit SWP may include one or more transistors. The switching unit SWP may perform the above-mentioned switching operation in response to a control signal of a controller provided to the display panel. In an exemplary embodiment, the first and second voltages V1 and V2 are provided by a voltage generator. The voltage generator may be disposed in the peripheral area PA or in an area external to the display panel.

The first voltage V1 and the second voltage V2 may include a direct current (DC) voltage or an alternating current (AC) voltage. In an embodiment, the first voltage V1 includes the driving voltage ELVDD, and the second voltage V2 includes a voltage applied to a pixel P, for example, a voltage different from a voltage applied to the transistor or the storage capacitor of the pixel circuit PC. In this case, a voltage wiring 1150 (see FIG. 1) configured to provide the second voltage V2 may be located in the peripheral area PA of the display panel 10A (see FIG. 1), and the wiring CL may extend to the peripheral area PA. In another embodiment, the first voltage V1 includes the driving voltage ELVDD, and the second voltage V2 includes a voltage of the source electrode, the drain electrode, or the gate electrode of the driving transistor T1.

The switching operation of the switching unit SWP may be performed on a single frame basis or a plurality of frames basis.

In an embodiment, as shown in FIGS. 5 and 6, the switching operation of the switching unit SWP is performed every N frames. For example, a voltage VN of the bottom layer BL may have the same voltage as the first voltage V1 during first N frames, and have the same voltage as the second voltage V2 during the next N frames by a switching operation TP1 of the switching unit SWP. Next, the voltage VN of the bottom layer BL may have the same voltage as the first voltage V1 again by a switching operation TP2 of the switching unit SWP. A frame of image data (i.e., image data for the entire display panel) may be output to the display panel during a frame period. For example, when N is 2, the bottom layer BL has the first voltage V1 when a first frame is output to the display panel during a first frame period and when a second frame is output to the display panel during a second frame period after the first frame period, and the bottom layer BL has the second voltage V2 when a third frame is output to the display panel during a third frame period after the second frame period and when a fourth frame is output to the display panel during a fourth frame period after the third frame period.

In another embodiment, referring to FIGS. 5 and 7, a switching operation of the switching unit SWP is performed every frame. For example, since the switching operations TP1 and TP2 are performed every frame, the voltage VN of the bottom layer BL alternately has the same voltage as the first voltage V1 and the same voltage as the second voltage V2. For example, the bottom layer BL has the first voltage V1 when a first frame is output to the display panel during a first frame period and has the second voltage V2 when a second frame is output to the display panel during a second frame period after the first frame period.

Figure 8:
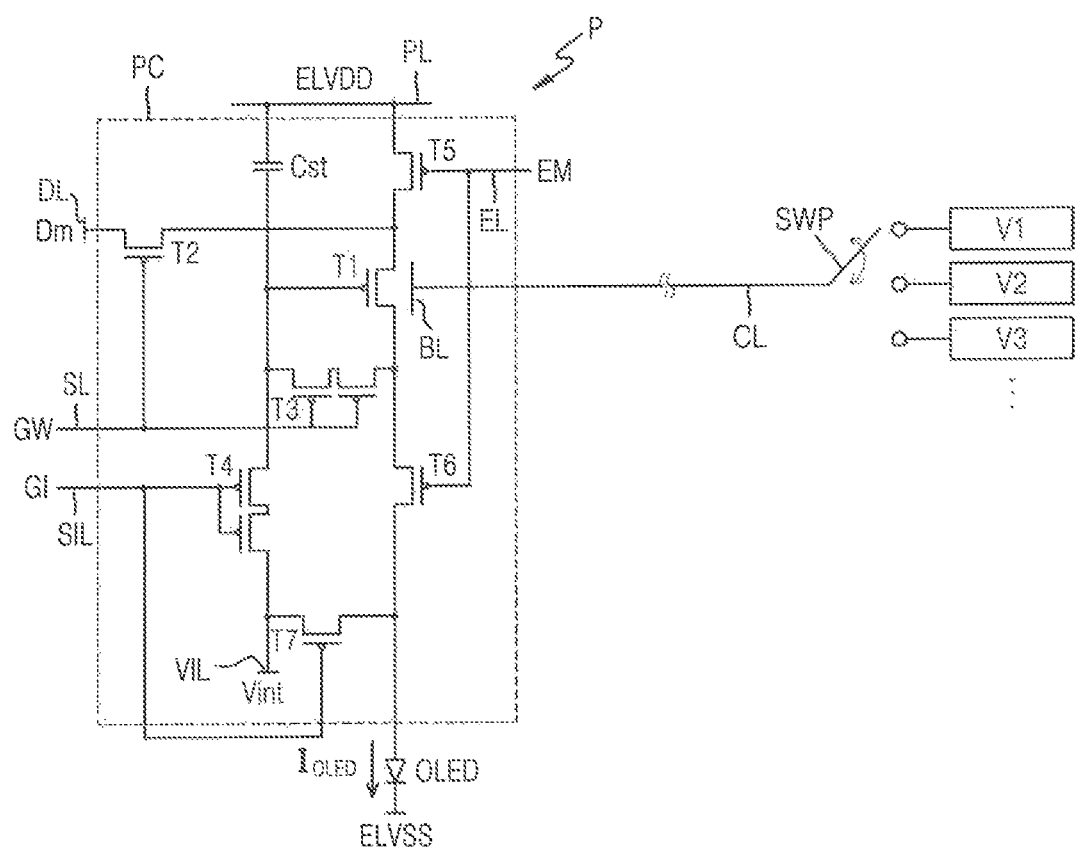
FIG. 8 is an equivalent circuit diagram of one of the pixels of a display panel according to an exemplary embodiment of the inventive concept.

FIG. 8 is an equivalent circuit diagram of one of the pixels of a display panel according to an exemplary embodiment of the inventive concept.

Referring to FIG. 8, the bottom layer BL has the same voltage as one or more of the first voltage V1, the second voltage V2, and the third voltage V3 by the switching operation of the switching unit SWP. In an embodiment, the switching operation of the switching unit SWP may be performed in the order of from the first voltage V1 to the second voltage V2, from the second voltage V2 to the third voltage V3, and from the third voltage V3 to the first voltage V1. Alternatively, the switching operation of the switching unit SWP may be performed in the order of the first voltage V1 to the third voltage V3, from the third voltage V3 to the second voltage V2, and from the second voltage V2 to the first voltage V1. Alternatively, the switching operation of the switching unit SWP may be performed in the order of from the first voltage V1 to the second voltage V2, from the second voltage V2 to the first voltage V1, and from the first voltage V1 to the third voltage V3, and from the third voltage V3 to the first voltage V1. In another embodiment, the switching operation of the switching unit SWP may be selectively performed in response to a predetermined control signal and performed regularly or at random. In an exemplary embodiment, the first through third voltages V1 to V3 differ from one another. In an exemplary embodiment, the first through third voltages V1-V3 are provided by a voltage generator. For example, the voltage generator may be disposed in the peripheral area PA or in an area external to the display panel.

Though FIG. 8 describes the first voltage V1, the second voltage V2, and the third voltage V3, the bottom layer BL may have the same voltage as at least one of four or more voltages.

As described with reference to FIGS. 5 to 7, the switching operation of the switching unit SWP may be performed between the first voltage V1 and the second voltage V2. Alternatively, as described with reference to FIG. 8, the switching operation of the switching unit SWP may be performed between the first voltage V1, the second voltage V2, and a third voltage V3. Accordingly, the voltage VN of the bottom layer BL may alternately have the same voltage level (see FIGS. 6 and 7) as the first voltage V1 or the second voltage V2, or the same voltage level (see FIG. 8) as a voltage selected between the first voltage V1, the second voltage V2, and the third voltage V3. In an embodiment, the switching unit SWP operates such that the voltage VN of the bottom layer BL is not connected to any of the first voltage V1, the second voltage V2, and the third voltage V3. For example, there may be timing in which the bottom layer BL is in a floated state. For example, the bottom layer BL could have the first voltage V1 when a first frame is output to the display panel, the second voltage V2 when a second frame is output to the display panel, the third voltage V3 when a third frame is output to the display panel, and the floating state when a fourth frame is output to the display panel. In an embodiment, the floating state is achieved by setting the bottom layer BL to a high impedance. For example, the bottom layer BL could be disconnected from a node that receives one of voltages V1-V3 to achieve the floating state.

Figure 9:
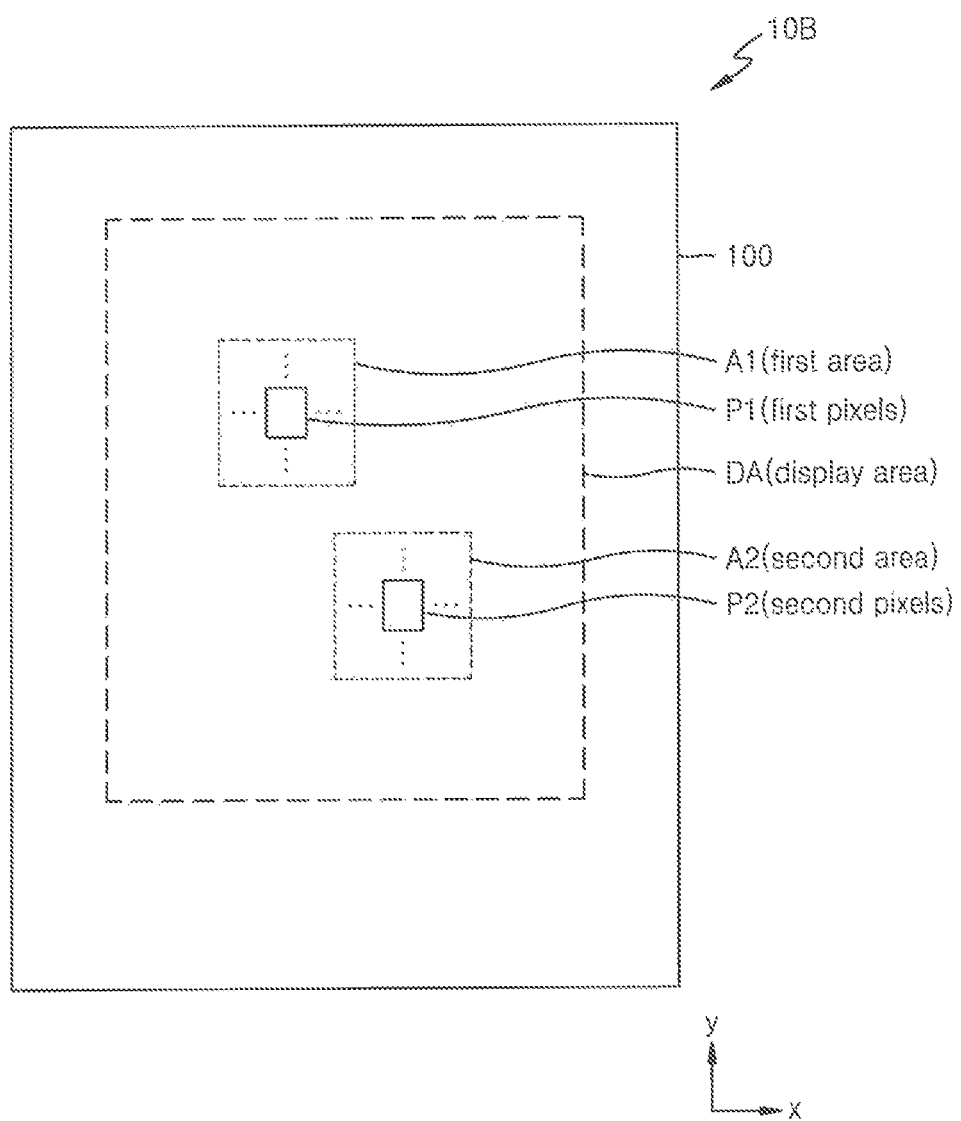
FIG. 9 is a plan view of a display panel according to an exemplary embodiment of the inventive concept.
Figure 10A:
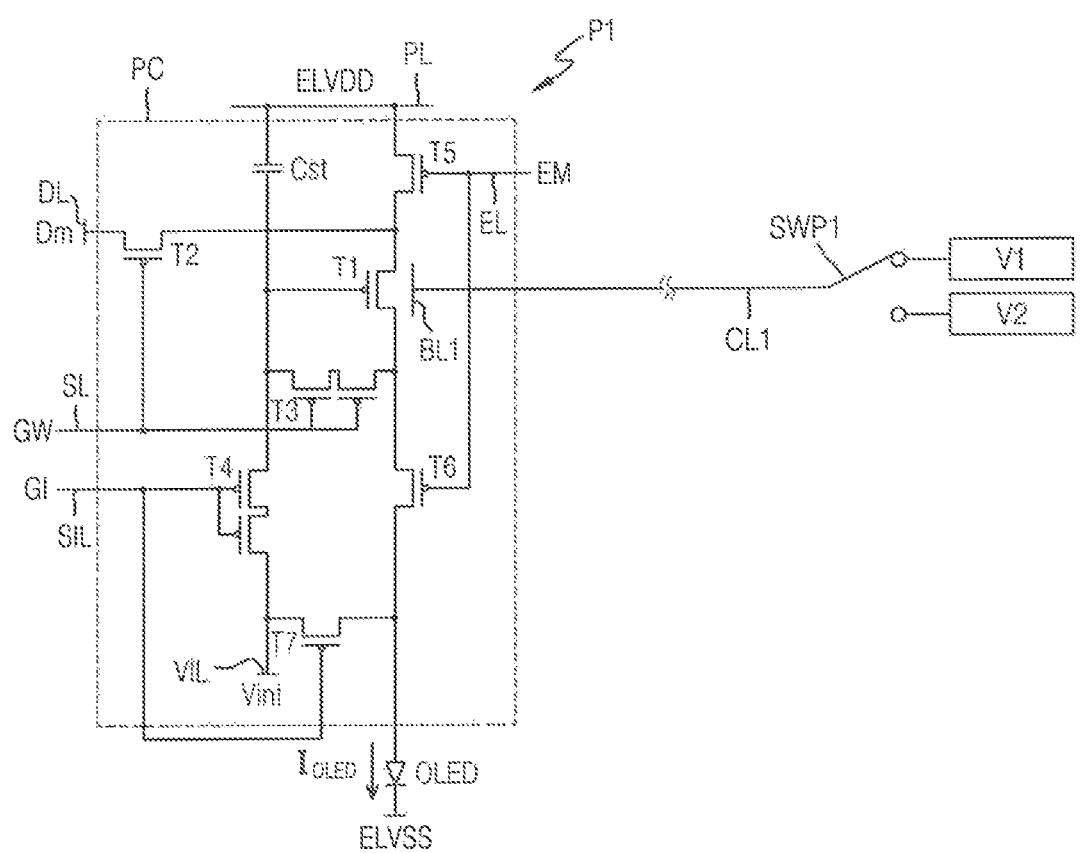
FIG. 10A is an equivalent circuit diagram of a first pixel according to an exemplary embodiment of the inventive concept.
Figure 10B:
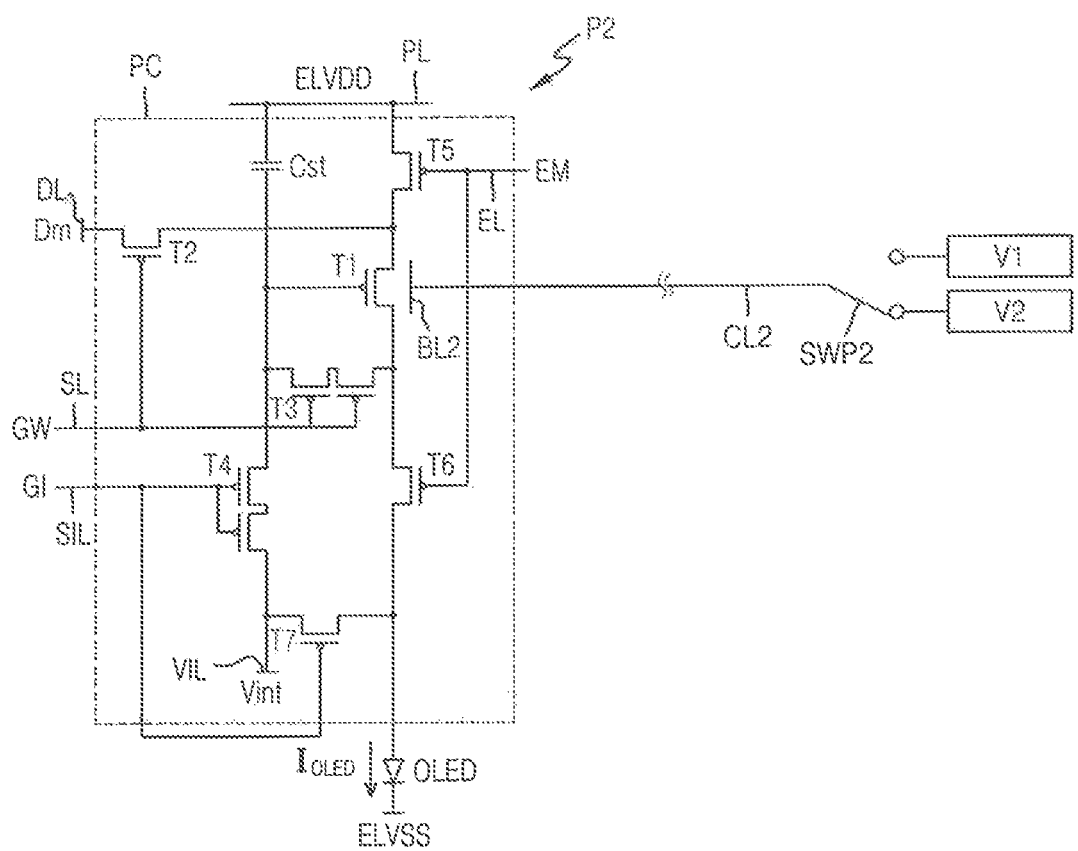
FIG. 10B is an equivalent circuit diagram of a second pixel according to an exemplary embodiment of the inventive concept.
Figure 11A:
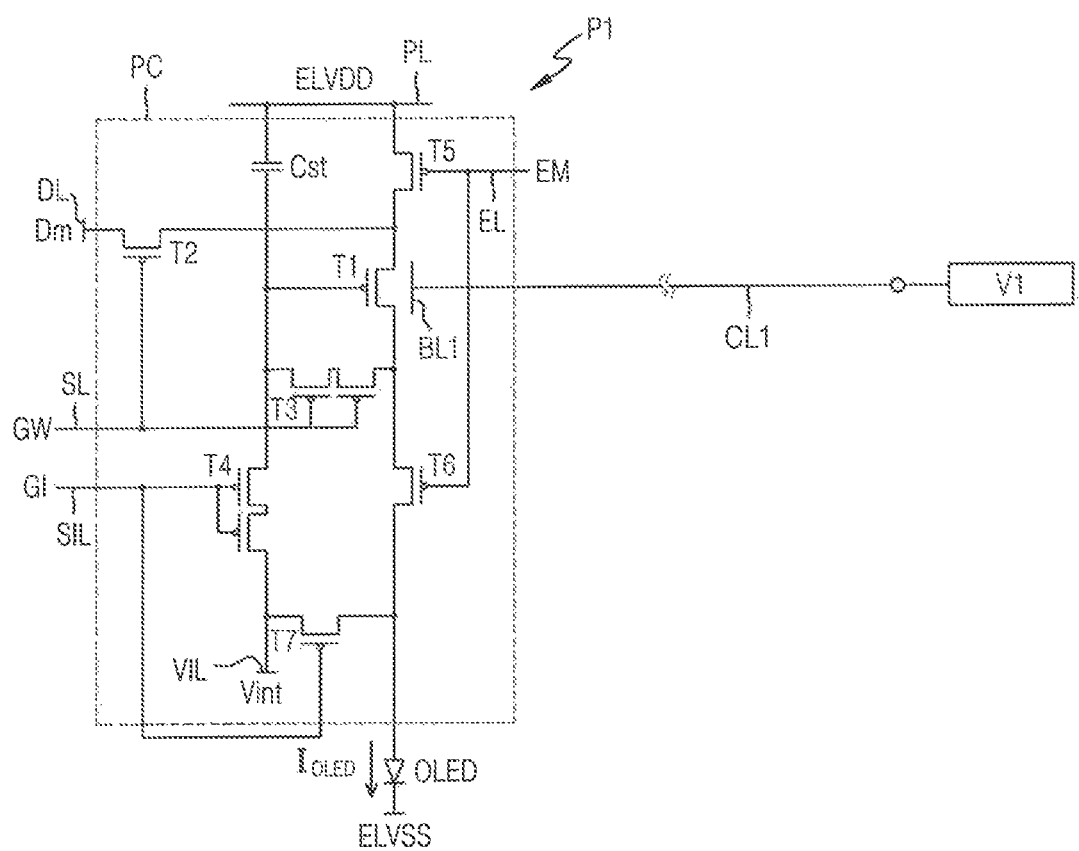
FIG. 11A is an equivalent circuit diagram of a first pixel according to an exemplary embodiment of the inventive concept.
Figure 11B:
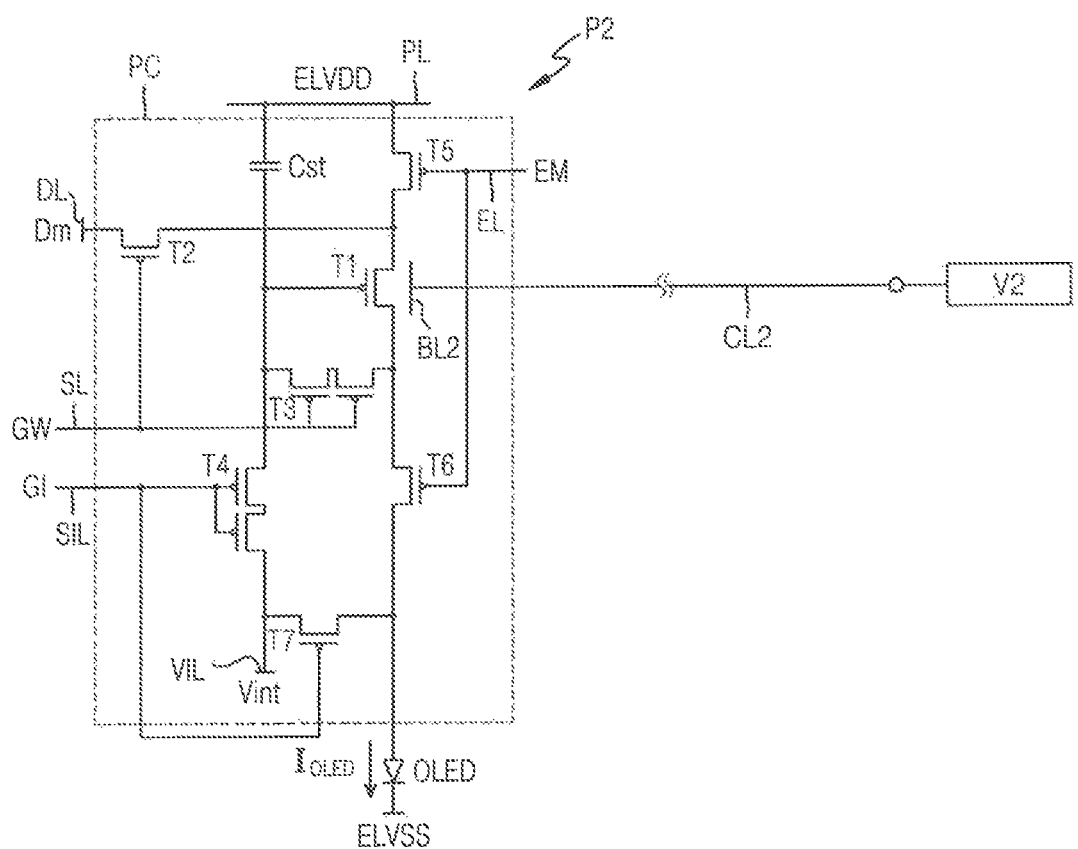
FIG. 11B is an equivalent circuit diagram of a second pixel according to an exemplary embodiment of the inventive concept.

FIG. 9 is a plan view of a display panel according to an exemplary embodiment of the inventive concept, FIG. 10A is an equivalent circuit diagram of a first pixel P1 according to an embodiment, FIG. 10B is an equivalent circuit diagram of a second pixel P2 according to an embodiment, FIG. 11A is an equivalent circuit diagram of the first pixel P1 according to another embodiment, and FIG. 11B is an equivalent circuit diagram of the second pixel P2 according to another embodiment. Though FIG. 9 mainly shows the first pixels P1 and the second pixels P2 of the display area DA, for convenience of description, the scan driver 1100, the data driver 1200, the first main power wiring 1130, the second main power wiring 1140, and/or the voltage wiring 1150, etc. described above with reference to FIG. 1 may be arranged. A voltage generator may supply voltages to the wirings 1130, 1140, and 1150. The voltage generator may be located on the display panel (e.g., in the peripheral area PA) or located in an area external to the display panel.

Referring to FIG. 9, the display area DA includes a first area A1 in which the first pixels P1 are arranged, and a second area A2 in which the second pixels P2 are arranged. As shown in FIGS. 10A and 10B, the first pixel P1 and the second pixel P2 may be the same circuit design as the pixel P described above with reference to FIG. 2. A bottom layer BL1 (referred to as a first bottom layer, hereinafter) of the first pixel P1 is connected to a first switching unit SWP1 through a first wiring CL1, and a bottom layer BL2 (referred to as a second bottom layer, hereinafter) of the second pixel P2 is connected to a second switching unit SWP2 through a second wiring CL2.

According to an embodiment, the switching unit SWP1 (referred to as a first switching unit, hereinafter) connected to the first bottom layer BL1 and the switching unit SWP2 (referred to as a second switching unit, hereinafter) connected to the second bottom layer BL2 operate independently of one another. For example, the first switching unit SWP1 and the second switching unit SWP2 may operate individually or independently, and thus a voltage of the first bottom layer BL1 may be the same as or different from a voltage of the second bottom layer BL2 during some period.

In another embodiment, the first switching unit SWP1 and the second switching unit SWP2 operate dependently or by influencing each other. For example, when the first switching unit SWP1 operates, the second switching unit SWP2 operates simultaneously, and a voltage of the first bottom layer BL1 is different from a voltage of the second bottom layer BL2. Alternatively, after an operation of the first switching unit SWP1, the second switching unit SWP2 operates, or after an operation of the second switching unit SWP2, the first switching unit SWP1 operates.

For example, the first voltage V1 may be applied to the first bottom layer BL1 of the first pixel P1 as shown in FIG. 10A, and the second voltage V2 may be applied to the second bottom layer BL2 of the second pixel P2 as shown in FIG. 10B. The first voltage V1 and the second voltage V2 may respectively have different voltages. The first voltage V1 and the second voltage V2 may include a voltage applied to the pixel circuit PC, or a voltage different from the voltage applied to the pixel circuit PC. For example, the first voltage V1 or the second voltage V2 may include the driving voltage ELVDD, the initialization voltage Vint, a gate voltage of a gate electrode of one of the transistors, a source voltage of a source electrode of one of the transistors, or a drain voltage of a drain electrode of one of the transistors. In an embodiment, one of the first voltage V1 and the second voltage V2 includes the driving voltage ELVDD, and the other includes the same voltage as the driving gate electrode, the driving source electrode, or the driving drain electrode of the driving transistor T1. In another embodiment, one of the first voltage V1 and the second voltage V2 includes the initialization voltage Vint, and the other may include the same voltage as the driving gate electrode, the driving source electrode, or the driving drain electrode of the driving transistor T1. Alternatively, one of the first voltage V1 and the second voltage V2 may include the driving voltage ELVDD or the initialization voltage Vint, and the other may include a voltage (e.g. an AC voltage or a DC voltage) different from the voltage applied to the pixel circuit PC. Alternatively, one of the first voltage V1 and the second voltage V2 may include a gate voltage of a gate electrode of one of the transistors, a source voltage of a source electrode of one of the transistors, or a drain voltage of a drain electrode of one of the transistors, and the other may include a voltage (e.g. an AC voltage or a DC voltage) different from the voltage applied to the pixel circuit PC. The first voltage V1 and the second voltage V2 may respectively have different voltages.

As described above with reference to FIGS. 6 and 7, each of the first switching unit SWP1 and the second switching unit SWP2 may perform a switching operation on a single frame basis or a plurality of frames basis. Alternatively, the switching operation of each of the first switching unit SWP1 and the second switching unit SWP2 is not performed after a specific time point. For example, the switching operation of each of the first switching unit SWP1 and the second switching unit SWP2 is not performed during or after a process of manufacturing the display panel 10B. Alternatively, a controller of the display panel 10B does not generate a control signal for a switching operation. In this case, an equivalent circuit diagram of the first pixel P1 is shown in FIG. 11A, and an equivalent circuit diagram of the second pixel P2 is shown in FIG. 11B. For example, the first bottom layer BL1 is connected to the first voltage V1 through the first wiring CL1, and the second bottom layer BL2 is connected to the second voltage V2 through the second wiring CL2.

Though it is shown in FIG. 9 that the first area A1 in which the first pixels P1 are arranged and the second area A2 in which the second pixels P2 are arranged are spaced apart from each other, the illustration of FIG. 9 is provided as an example and embodiments of the present inventive concept are not limited thereto. In another embodiment, as shown in FIGS. 12A to 12E, the first area A1 and the second area A2 may be variously arranged.

FIGS. 12A to 12E are plan views of a display area of a display panel according to an exemplary embodiment of the inventive concept.

Figure 12A:
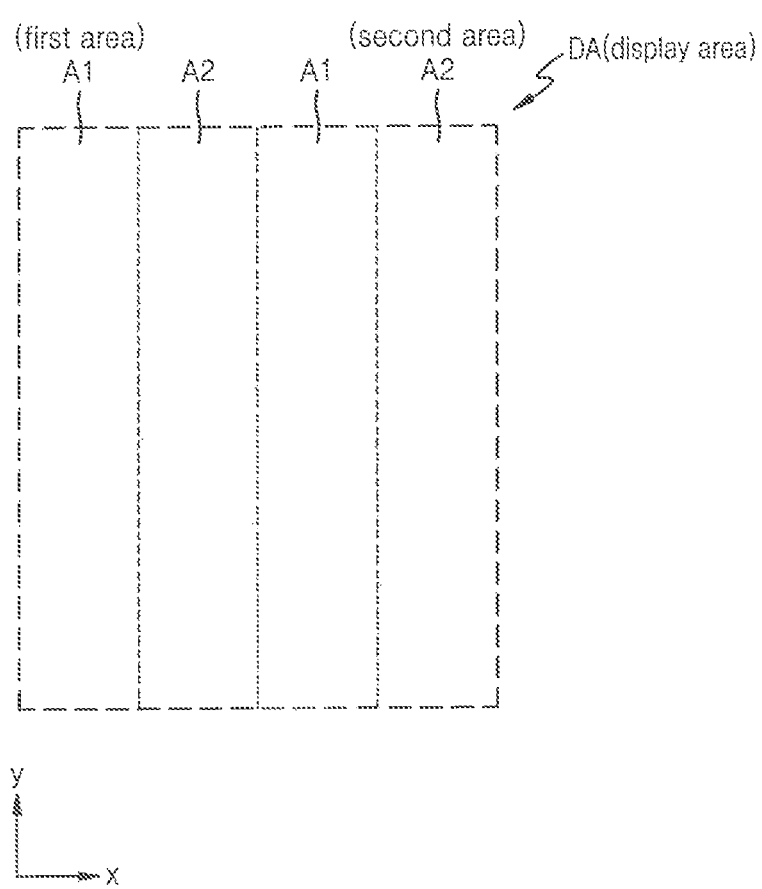
FIGS. 12A to 12E are plan views of a display area of a display panel according to an exemplary embodiment of the inventive concept.
Figure 12B:
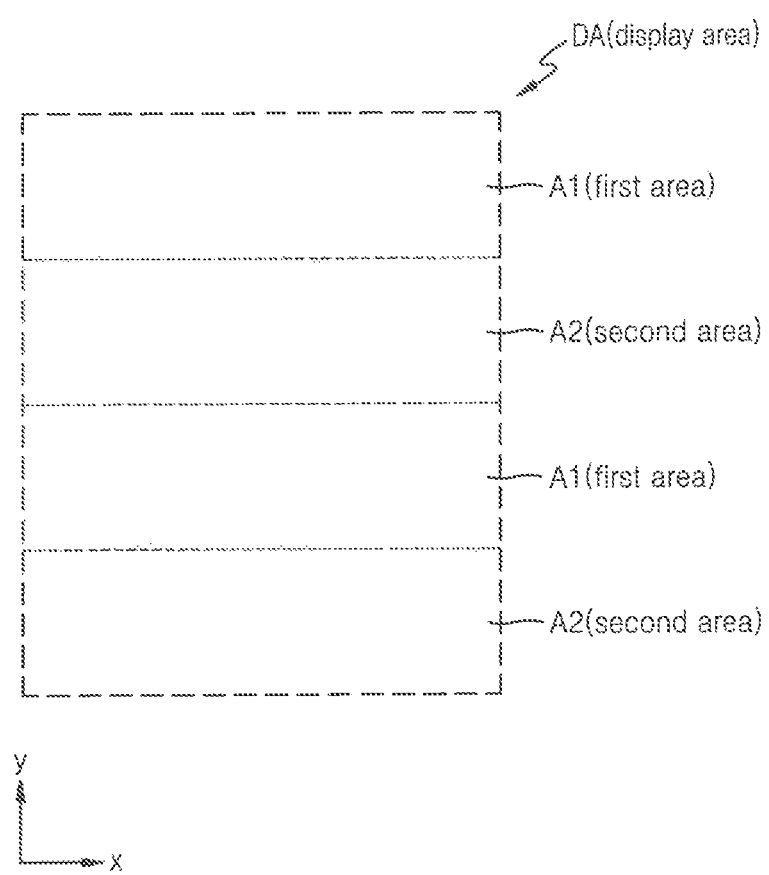
Figure 12C:
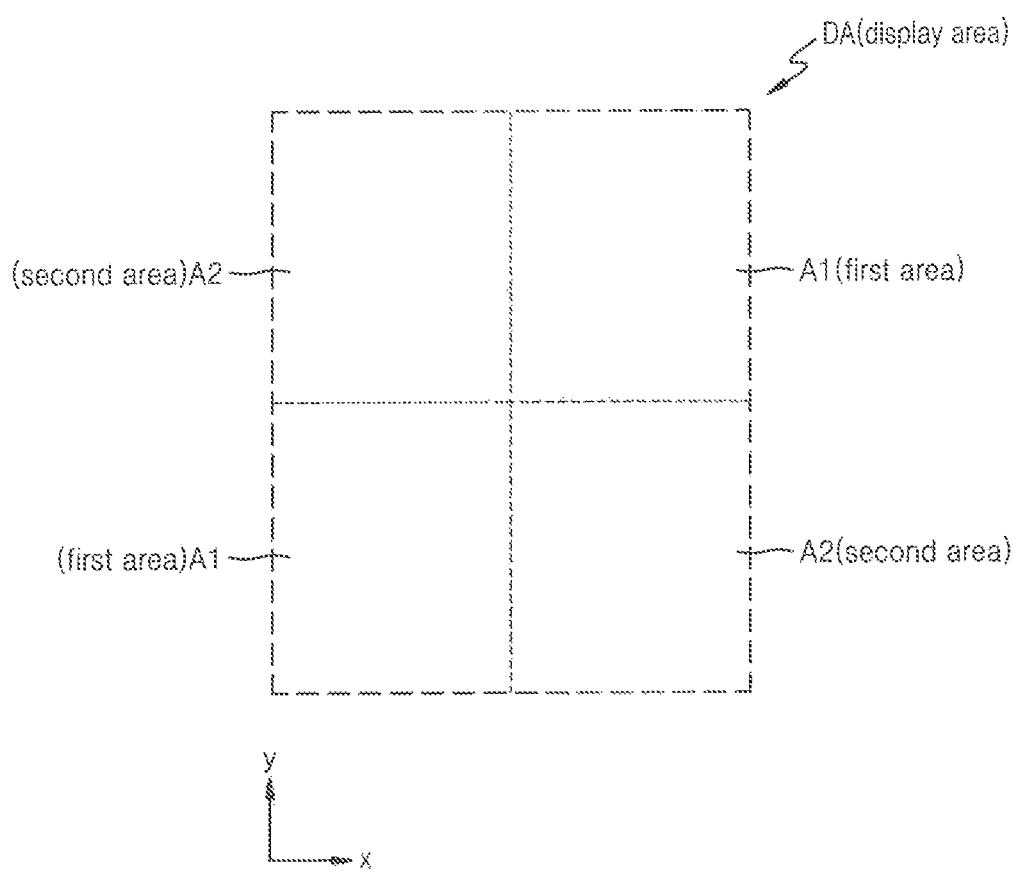
Figure 12D:
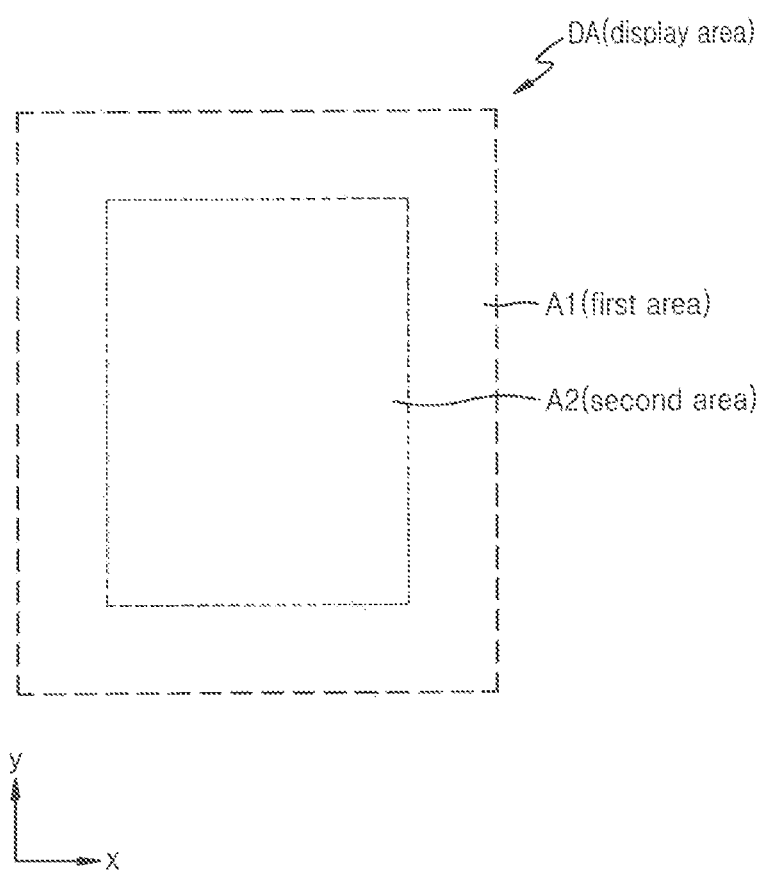
Figure 12E:
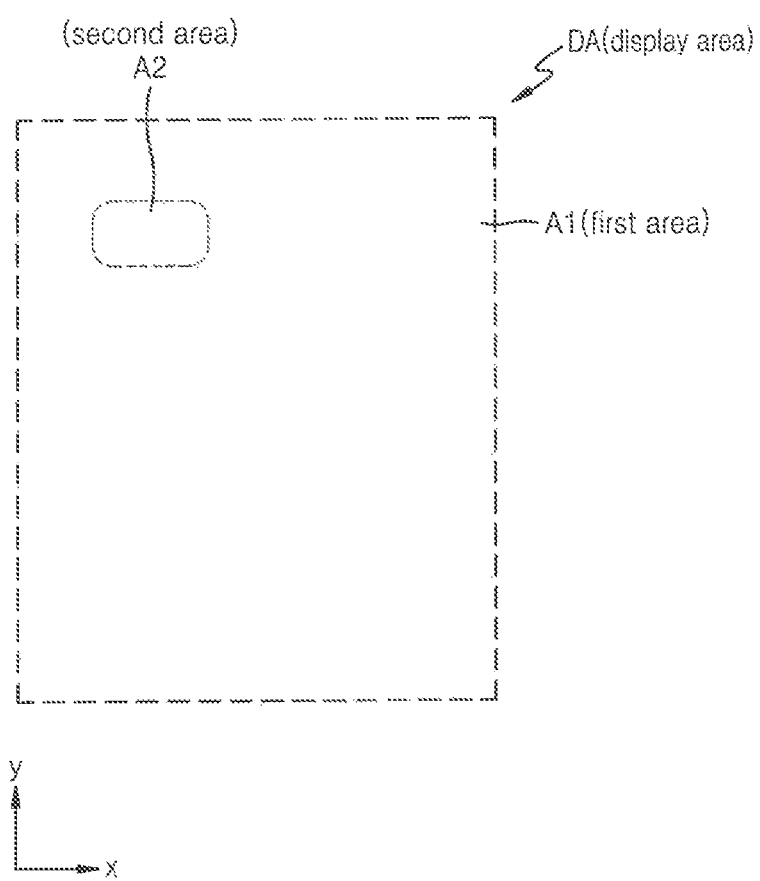

Referring to FIG. 12A, the first area A1 and the second area A2 extend in the display area DA in a y-direction. The first area A1 and the second area A2 are alternately arranged in an x-direction. Referring to FIG. 12B, the first area A1 and the second area A2 extend in the display area DA in the x-direction. The first area A1 and the second area A2 are alternately arranged in the y-direction. Alternatively, as shown in FIG. 12C, the first area A1 and the second area A2 are arranged such that corner portions thereof are bonded, or as shown in FIGS. 12D and 12E, the first area A1 and the second area A2 are arranged such that the second area A2 is surrounded by the first area A1. In FIG. 12C, the display area DA is divided into a matrix of tiles, where tiles along one of the diagonals correspond to the first area A1 and tiles along the other of the diagonals corresponds to the second area A2. In an embodiment, as shown in FIG. 12D, an area of the second area A2 is the same as or greater than an area of the first area A1, or as shown in FIG. 12E, the area of the second area A2 is much smaller than the area of the first area A1.

Figure 13:
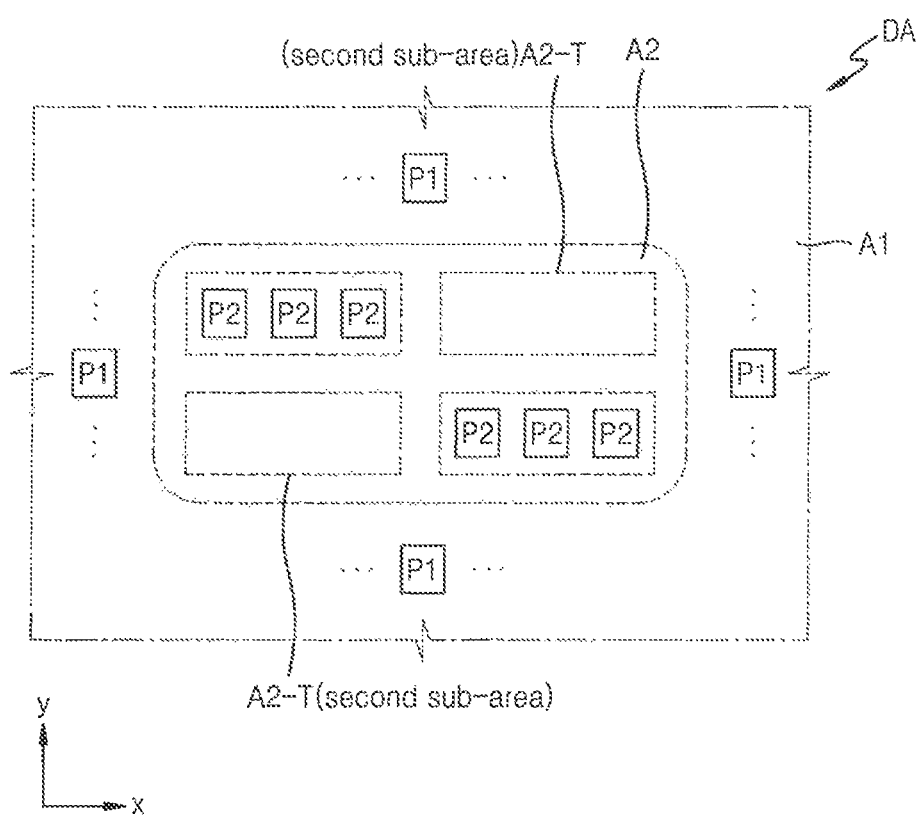
FIG. 13 is a plan view of a portion of a display area of a display panel according to an exemplary embodiment of the inventive concept.
Figure 14:
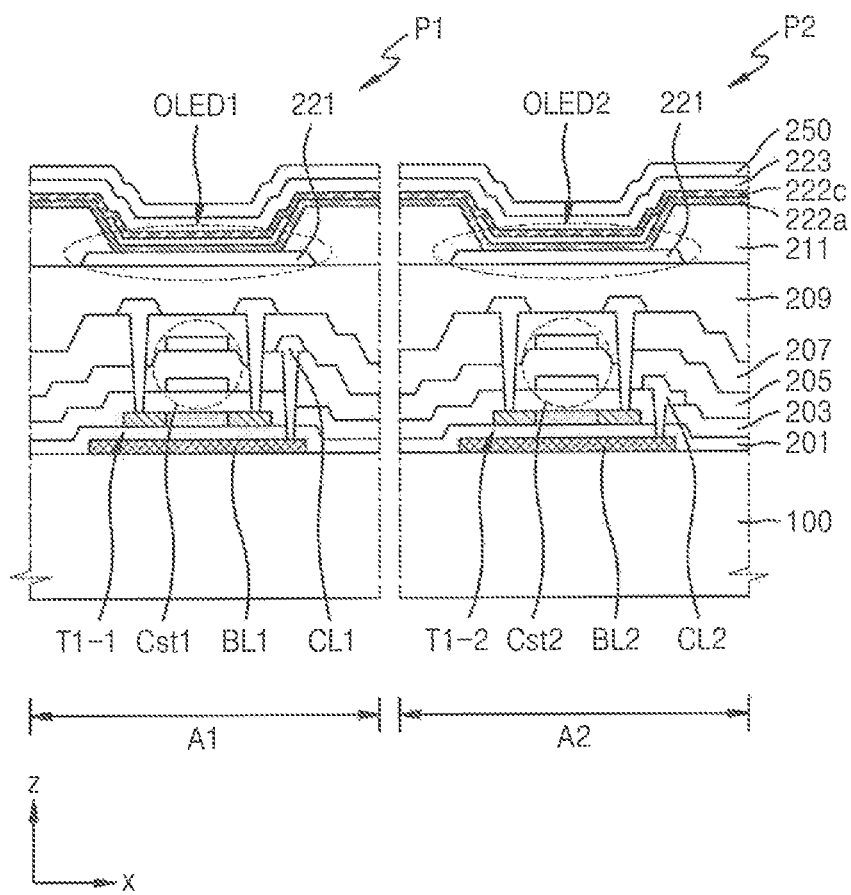
FIG. 14 is a cross-sectional view of a first pixel and a second pixel of a display panel according to an exemplary embodiment of the inventive concept.
Figure 15:
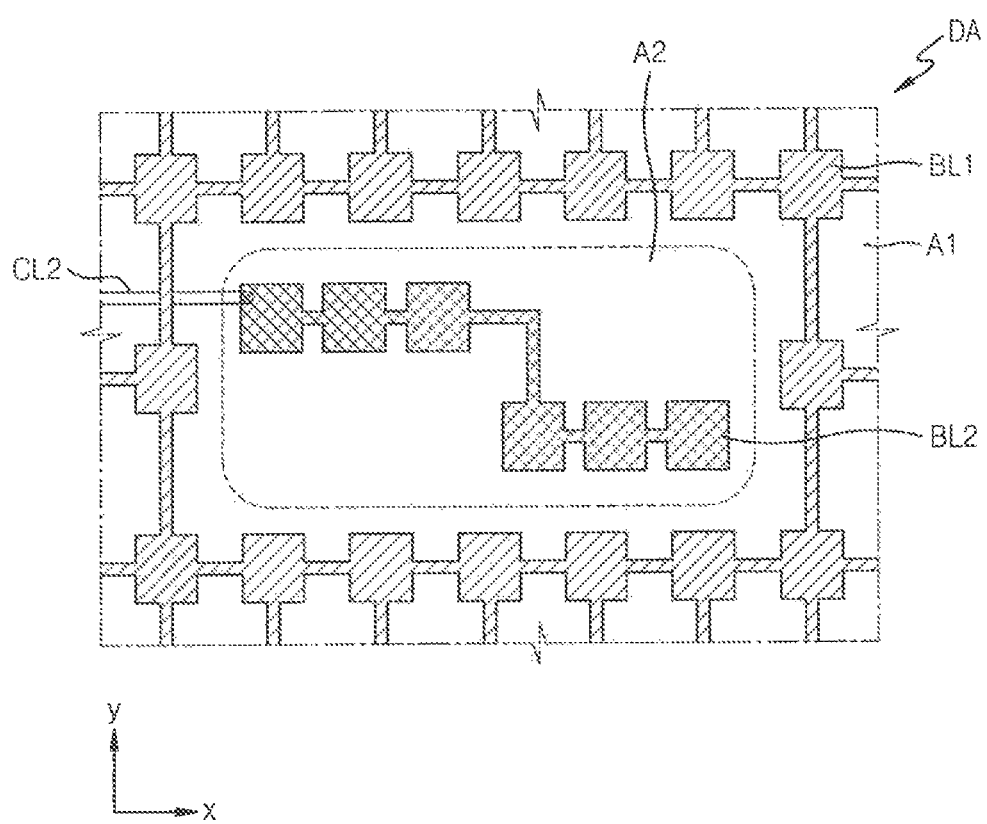
FIG. 15 is a plan view of a first bottom layer and a second bottom layer of a display panel according to an exemplary embodiment of the inventive concept.
Figure 16:
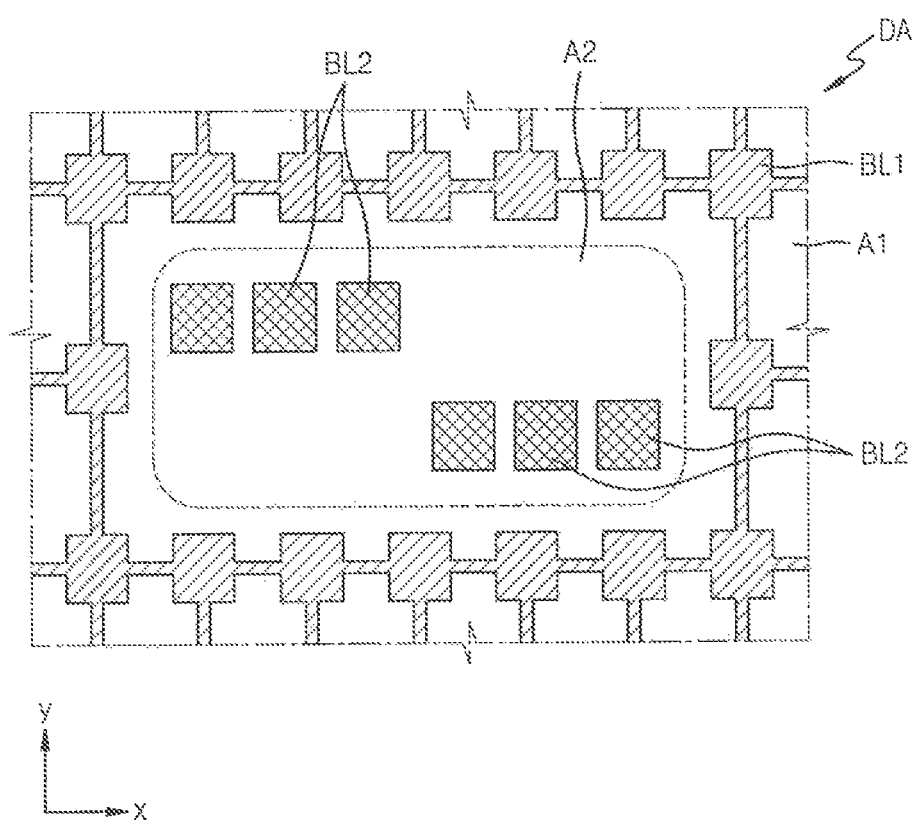
FIG. 16 is a plan view of a first bottom layer and a second bottom layer of a display panel according to an exemplary embodiment of the inventive concept.

FIG. 13 is a plan view of a portion of a display area of a display panel according to an exemplary embodiment of the inventive concept, FIG. 14 is a cross-sectional view of the first pixel P1 and the second pixel P2 of a display panel according to an exemplary embodiment of the inventive concept, FIG. 15 is a plan view of a first bottom layer and a second bottom layer provided to a display panel according to an exemplary embodiment of the inventive concept, and FIG. 16 is a plan view of a first bottom layer and a second bottom layer provided to a display panel according to an exemplary embodiment of the inventive concept. For convenience of description, an encapsulation member included in the display panel is omitted in FIG. 14.

Referring to FIG. 13, the display area DA includes the first area A1 in which the first pixels P1 are arranged and the second area A2 in which the second pixels P2 are arranged, and the first area A1 surrounds the second area A2. The second area A2 may be located between the first pixels P1 that neighbor each other, and the second pixels P2 arranged in the second area A2 may be located between the first pixels P1 that neighbor each other.

The second pixels P2 may be arranged in a portion of the second area A2. The second area A2 may include a first sub-area in which the second pixels P2 are arranged, and a second sub-area A2-T (referred to as a transmissive area, hereinafter) that transmits light. In an embodiment, the second pixels P2 are not arranged in the transmissive area A2-T. In an embodiment, no pixels are arranged in the transmissive area A2-T.

As shown in FIG. 14, the first pixel P1 and the second pixel P2 may include the first bottom layer BL1 and the second bottom layer BL2, respectively. Thus, a detailed structure of the first pixel P1 and the second pixel P2 is the same as that described above with reference to FIG. 3. For example, the first pixel P1 may include a driving transistor T1-1 (referred to as a first driving transistor) and a storage capacitor Cst1 (referred to as a first storage capacitor, hereinafter). The second pixel P2 may include a driving transistor T1-2 (referred to as a second driving transistor) and a storage capacitor Cst2 (referred to as a second storage capacitor, hereinafter). Each of the first driving transistor T1-1 and the second driving transistor T1-2 may have the same structure as that of the driving transistor described above with reference to FIG. 3, and each of the first storage capacitor Cst1 and the second storage capacitor Cst2 may have the same structure as that of the storage capacitor Cst described above with reference to FIG. 3. Likewise, each of an organic light-emitting diode OLED1 (referred to as a first organic light-emitting diode, hereinafter) of the first pixel P1 and an organic light-emitting diode OLED2 (referred to as a second organic light-emitting diode, hereinafter) of the second pixel P2 may have the same structure as the organic light-emitting diode described above with reference to FIG. 3.

In an exemplary embodiment, the first wiring CL1 providing a voltage to the first bottom layer BL1 is arranged on a layer different from a layer on which the second wiring CL2 providing a voltage to the second bottom layer BL2 is arranged. With regard to this, it is shown in FIG. 14 that the first wiring CL1 is arranged on the first interlayer insulating layer 205, and the second wiring CL2 is arranged on the gate insulating layer 203.

Voltages respectively applied to the first bottom layer BL1 and the second bottom layer BL2 are the same as those described above with reference to FIGS. 10A and 10B, or 11A and 11B. In an embodiment, as shown in FIGS. 11A and 11B, the first voltage V1 and the second voltage V2, which are different from each other, are applied to the first bottom layer BL1 and the second bottom layer BL2, respectively.

For example, a voltage that is the same as the driving voltage is applied to the first bottom layer BL1, and a voltage that is different from a voltage applied to the pixel circuit is applied to the second bottom layer BL2. In this case, as shown in FIG. 15, the first bottom layers BL1 respectively provided to the first pixels P1 are connected to each other, and, likewise, the second bottom layers BL2 respectively provided to the second pixels P2 are connected to each other. For example, the first bottom layers BL1 may include a number of first overlap conductors that each overlap a respective transistor of a respective pixel of the first area A1 and a number of first bridging conductors that connect the first overlap conductors together. For example, the second bottom layers BL2 may include a number of second overlap conductors that each overlap a respective transistor of a respective pixel of the second area A2 and a number of second bridging conductors that connect the second overlap conductors together. The first bottom layers BL1 and the second bottom layers BL2 are separated spatially and electrically. Though not shown in FIG. 15, the first wiring CL1 (see FIG. 14) connected to the first bottom layer BL1 may extend to the peripheral area PA (see FIG. 1) of the display panel and may be connected to the first main power wiring 1130 or may be connected to the driving voltage line PL (see FIG. 1) crossing the first area A1. The second wiring CL2 connected to the second bottom layer BL2 may extend to the peripheral area PA (see FIG. 1) of the display panel and may be electrically connected to the voltage wiring 1150 arranged in the peripheral area PA.

In another embodiment, a voltage that is the same as the driving voltage is applied to the first bottom layer BL1, and a voltage that is the same as a source voltage of a source electrode of the second driving transistor T1-2, a drain voltage of a drain electrode of the second driving transistor T1-2, or a gate voltage of a gate electrode of the second driving transistor T1-2 may be applied to the second bottom layer BL2. In this case, as shown in FIG. 16, the first bottom layers BL1 respectively provided to the first pixels P1 are connected to each other. The second bottom layers BL2 respectively provided to the second pixels P2 are spaced apart from each other. Each of the second bottom layers BL2 provided to the second pixels P2 may be connected to a driving source electrode, a driving drain electrode, or a driving gate electrode of the second driving transistor T1-2 through the second wiring CL2 (see FIG. 14).

Figure 17:
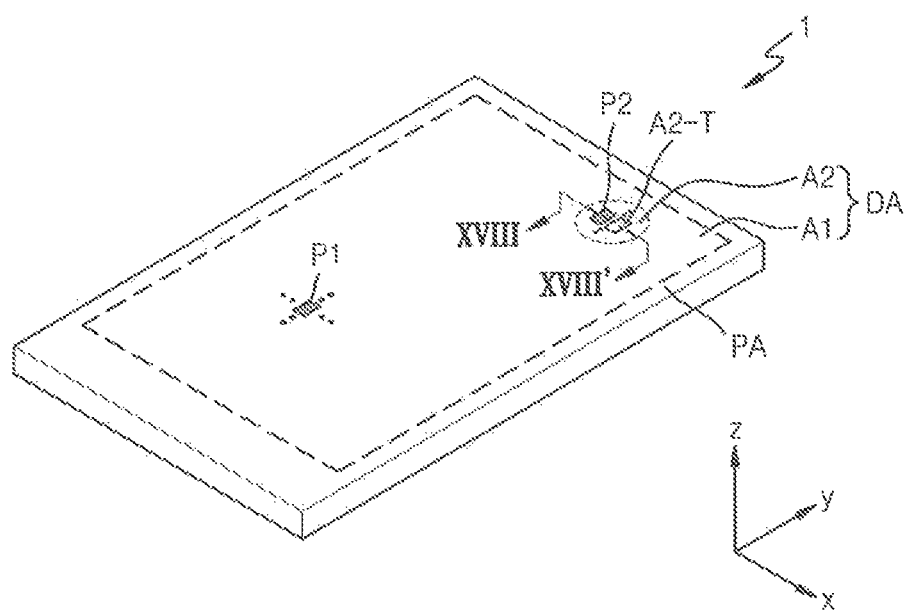
FIG. 17 is a perspective view of a display device including a display panel according to an exemplary embodiment of the inventive concept.
Figure 18:
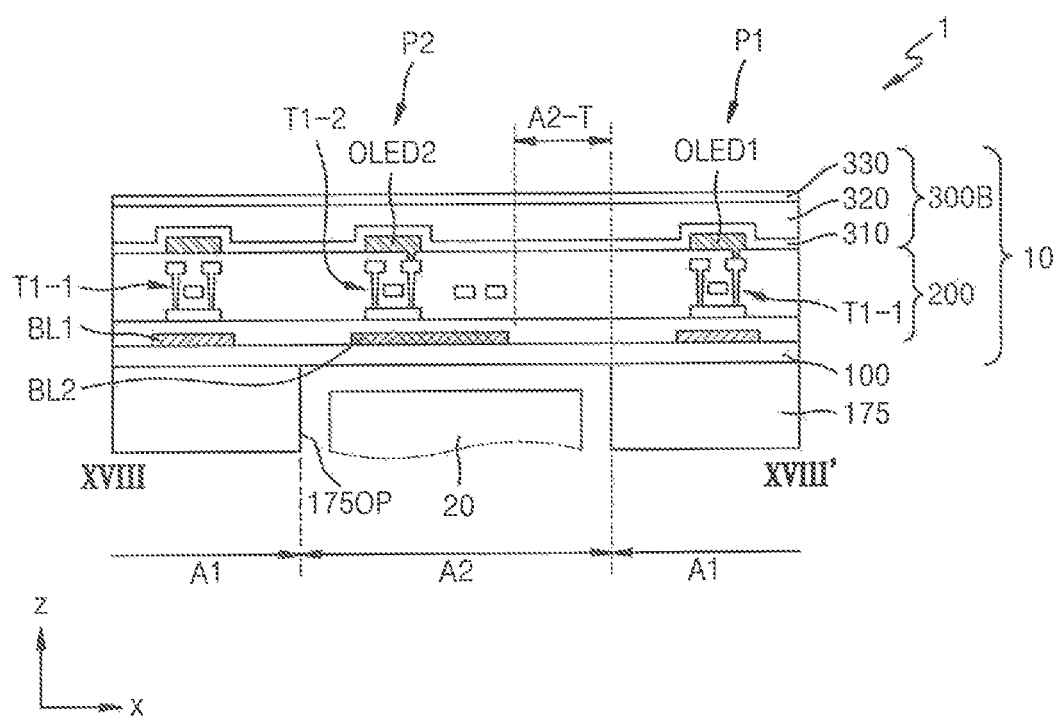
FIG. 18 is a cross-sectional view taken along line XVIII-XVIII' of FIG. 17.

FIG. 17 is a perspective view of a display device 1 including a display panel according to an exemplary embodiment of the inventive concept and FIG. 18 is a cross-sectional view of the display device 1, taken along line XVIII-XVIII' of FIG. 17.

Referring to FIGS. 17 and 18, the display device 1 includes the display area DA and the peripheral area PA. As described above with reference to FIG. 14, the display area DA includes the first area A1 and the second area A2. The first pixels P1 are arranged in the first area A1, and the second pixels P2 are arranged in the second area A2. The second area A2 includes the transmissive area A2-T in which the pixels are not arranged.

As shown in FIG. 18, the display device 1 includes a display panel 10 including a display element. The display panel 10 includes the substrate 100, a display element layer 200 on the substrate 100, and the thin-film encapsulation layer 300B as an encapsulation member sealing the display element layer 200. The display element layer 200 includes the first driving transistor T1-1 and the second driving transistor T1-2 and the first organic light-emitting diode OLED1 and the second organic light-emitting diode OLED2 respectively electrically connected to the first driving transistor T1-1 and the second driving transistor T1-2. Detailed description thereof is the same as that made above with reference to FIGS. 3 and 14.

The display panel 10 may further include a lower protective film 175 arranged under the substrate 100. The lower protective film 175 may include an opening 175OP corresponding to the second area A2.

The display device 1 may include a component 20 located in the second area A2. The component 20 may include an electronic element configured to emit and/or receive light, for example, a sensor or a camera. In an embodiment, the component 20 may collect data used in recognizing a portion (e.g. a fingerprint, a face, an iris, etc.) of a human body, or recognizing a distance, etc. to a person or an object that neighbors the display device 1. Light emitted from the component 20 and/or incident to the component 20 may include light in an infrared band, a visible light band, or an ultraviolet band. In an embodiment, in the case where the component 20 emits light, the second bottom layer BL2 located in the second area A2 may have an area that may entirely cover transistors included in each second pixel P2. For example, in the case where the second pixel P2 includes seven transistors as described above with reference to FIG. 11B, the second bottom layer BL2 may have an area that covers the seven transistors (e.g. semiconductor layers of the transistors) in the lower direction.

Embodiments of the inventive concept may remove an afterimage depending on an image displayed on a display panel and/or for each section of a display area, or may improve the performance of a thin film transistor by using a bottom layer, thereby resulting in a high-quality display panel.

Although the disclosure has been described with reference to the embodiments illustrated in the drawings, this is merely provided as an example and it will be understood by those of ordinary skill in the art that various changes in form and details and equivalents thereof may be made therein without departing from the spirit and scope of the inventive concept.

What is claimed is:

1. A display panel comprising:
a substrate;
a first pixel arranged over the substrate and including a first transistor and a first display element electrically connected to the first transistor; and
a first bottom layer arranged between the substrate and the first transistor,
wherein the first bottom layer has a first voltage in a first period and has a second voltage in a second period different from the first period, wherein the first and second voltages differ from one another,
wherein one of the first voltage and the second voltage is a voltage applied to an electrode of the first transistor,
wherein the first pixel further includes a driving voltage line configured to provide a driving voltage, and the other of the first voltage and the second voltage is the driving voltage.

2. The display panel of claim 1, wherein the one of the first voltage and the second voltage is one of a gate voltage applied to a gate electrode of the first transistor, a source voltage applied to a source electrode of the first transistor, and a drain voltage applied to a drain electrode of the first transistor.

3. The display panel of claim 1, wherein the first display element includes an organic light-emitting diode, and the first pixel includes a driving transistor, a switching transistor, and a storage capacitor, each being electrically connected to the organic light-emitting diode.

4. The display panel of claim 3, wherein the first transistor is the driving transistor.

5. The display panel of claim 4, further comprising:
a second pixel arranged over the substrate and including a second transistor and a second display element electrically connected to the second transistor; and
a second bottom layer arranged between the substrate and the second transistor,
wherein the second bottom layer has a third voltage in a third period and has a fourth voltage in a fourth period different from the third period, where the third and fourth voltages differ from one another.

6. The display panel of claim 5, further comprising:
a first switching circuit electrically connected to the first bottom layer; and
a second switching circuit electrically connected to the second bottom layer,
wherein a switching operation of the first switching circuit depends on a switching operation of the second switching circuit.

7. The display panel of claim 6, wherein a voltage of the first bottom layer is different from a voltage of the second bottom layer during a same time period.

8. The display panel of claim 1, wherein the first bottom layer includes metal.

9. A display panel comprising:
a substrate;
a plurality of first pixels, each arranged in a first area of the substrate and including a first transistor and a first display element electrically connected to the first transistor;
a plurality of second pixels, each arranged in a second area of the substrate and including a second transistor and a second display element electrically connected to the second transistor;
a first bottom layer arranged between the substrate and the first transistor;
a second bottom layer arranged between the substrate and the second transistor; and
a switching circuit configured to apply a first voltage to the first bottom layer and a second voltage to the second bottom layer, during a first period,
wherein the switching circuit is configured to apply the second voltage to the first bottom layer and the first voltage to the second bottom layer, during a second period different from the first period, and
wherein the first voltage is different from the second voltage.

10. The display panel of claim 9, wherein the first bottom layer is electrically insulated from the second bottom layer.

11. The display panel of claim 10, further comprising:
a voltage wiring arranged over the substrate and not electrically connected to the first pixel and the second pixel,
wherein the first bottom layer or the second bottom layer has a same voltage as that of the voltage wiring.

12. The display panel of claim 9, further comprising:
a first main power wiring arranged over the substrate and configured to provide a driving voltage; and
a second main power wiring arranged over the substrate and configured to provide a common voltage.

13. The display panel of claim 12, wherein the first bottom layer or the second bottom layer has a same voltage as the driving voltage.

14. The display panel of claim 9, wherein the first bottom layer or the second bottom layer has a same voltage as a gate voltage, a source voltage, or a drain voltage of an electrode of the first transistor or the second transistor.

15. The display panel of claim 9, wherein each of the first pixel and the second pixel includes a driving transistor, a switching transistor, and a storage capacitor, and the first transistor includes the driving transistor of the first pixel, and the second transistor includes the driving transistor of the second pixel.

16. The display panel of claim 9, wherein the second bottom layer overlaps a switching transistor and a storage capacitor of the second pixel.

17. The display panel of claim 16, wherein the second area includes a transmissive area that transmits light.

18. The display panel of claim 9, wherein each of the first bottom layer and the second bottom layer includes metal.

* * * * *